(12) United States Patent
Feinstein et al.

(10) Patent No.: US 9,808,099 B2
(45) Date of Patent: Nov. 7, 2017

(54) METHOD SYSTEM AND KIT FOR PRODUCING INFORMATIONAL EXHIBITS

(71) Applicant: Eureka Exhibits LLC, Greer, SC (US)

(72) Inventors: Keith Feinstein, Stirling, NJ (US); Mark Kirby, Greer, SC (US)

(73) Assignee: Eureka Exhibits, Greer, SC (US)

( * ) Notice: Subject to any disclaimer, the term of this patent is extended or adjusted under 35 U.S.C. 154(b) by 0 days.

(21) Appl. No.: 15/386,086

(22) Filed: Dec. 21, 2016

(65) Prior Publication Data

US 2017/0188719 A1   Jul. 6, 2017

Related U.S. Application Data

(63) Continuation of application No. 14/948,923, filed on Nov. 23, 2015, now Pat. No. 9,526,332, which is a continuation of application No. 14/578,462, filed on Dec. 21, 2014, now Pat. No. 9,198,306.

(60) Provisional application No. 61/919,777, filed on Dec. 22, 2013.

(51) Int. Cl.

| | | |
|---|---|---|
| *G07F 17/32* | (2006.01) | |
| *G06F 17/00* | (2006.01) | |
| *A47F 3/00* | (2006.01) | |
| *A47B 81/06* | (2006.01) | |
| *A47B 47/00* | (2006.01) | |
| *A47B 81/00* | (2006.01) | |
| *A47F 3/06* | (2006.01) | |
| *G09B 19/00* | (2006.01) | |

(52) U.S. Cl.
CPC .......... *A47F 3/004* (2013.01); *A47B 47/0091* (2013.01); *A47B 81/00* (2013.01); *A47B 81/06* (2013.01); *A47F 3/06* (2013.01); *G09B 19/0046* (2013.01)

(58) Field of Classification Search
CPC . A47F 3/004; A47F 3/06; A47F 17/32; A47B 47/0091; A47B 81/06; H05K 5/0017; G07F 17/3211; G07F 17/3239; G07F 17/3244; G07F 17/00; G06F 19/00; G09B 19/0046
USPC ......... 463/20, 25; 348/836, E5.128; 52/36.4, 52/793.11; 705/2, 24, 38
See application file for complete search history.

(56) References Cited

U.S. PATENT DOCUMENTS

| | | | |
|---|---|---|---|
| 9,198,306 B1 * | 11/2015 | Feinstein | ................. A47F 3/00 |
| 2008/0055491 A1 * | 3/2008 | Gordon | ............... G07F 17/3202 348/836 |
| 2013/0310151 A1 * | 11/2013 | Richards | ............. G07F 17/3244 463/25 |
| 2015/0072769 A1 * | 3/2015 | Ratner | ................ G07F 17/3244 463/25 |
| 2015/0087396 A1 * | 3/2015 | Norris | ..................... G07F 17/32 463/25 |
| 2015/0087401 A1 * | 3/2015 | Glenn, II | ............ G07F 17/3216 463/25 |

* cited by examiner

*Primary Examiner* — Dao H Nguyen

(57) ABSTRACT

A modular system includes modular components capable of easy assembly, disassembly, and reuse. The system has a J-form component, I-form component, terminal components, and structural components. The system also includes removable mounting plates for assembly. The components are capable of enclosing, supporting, and displaying electronic, mechanical, and audio-visual displays.

18 Claims, 29 Drawing Sheets

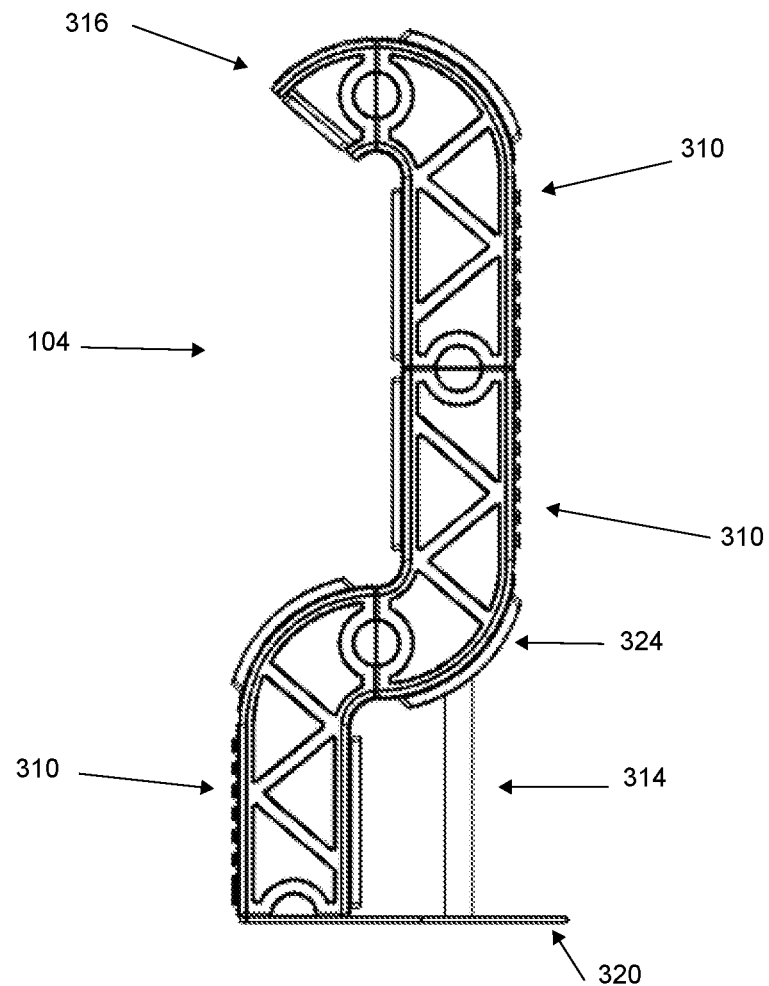
FIGURE 3.A.

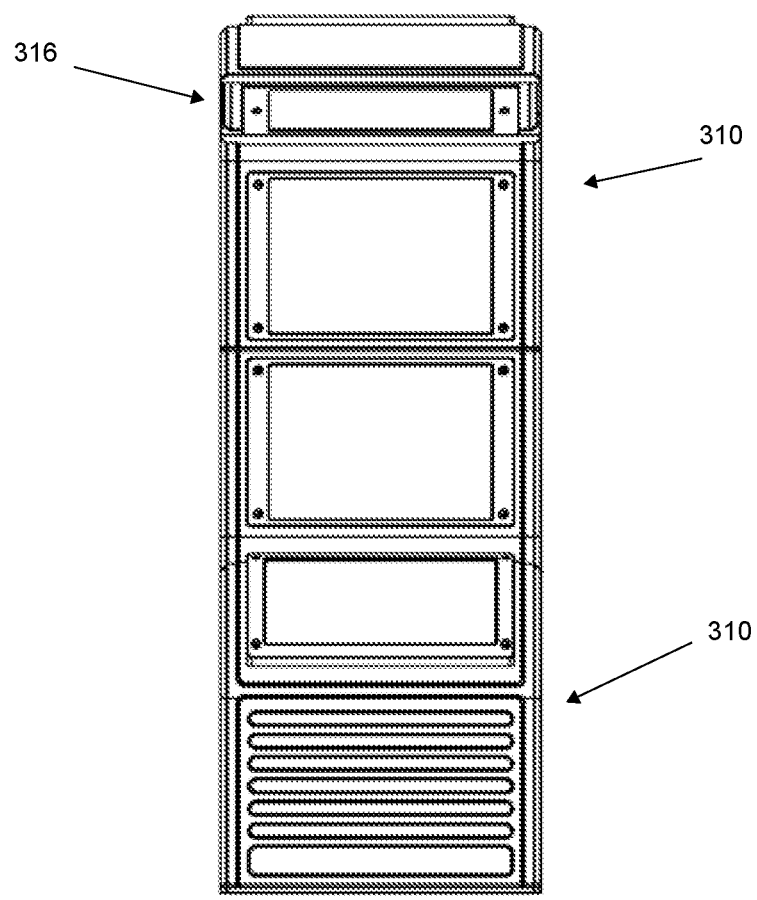
FIGURE 3.B.

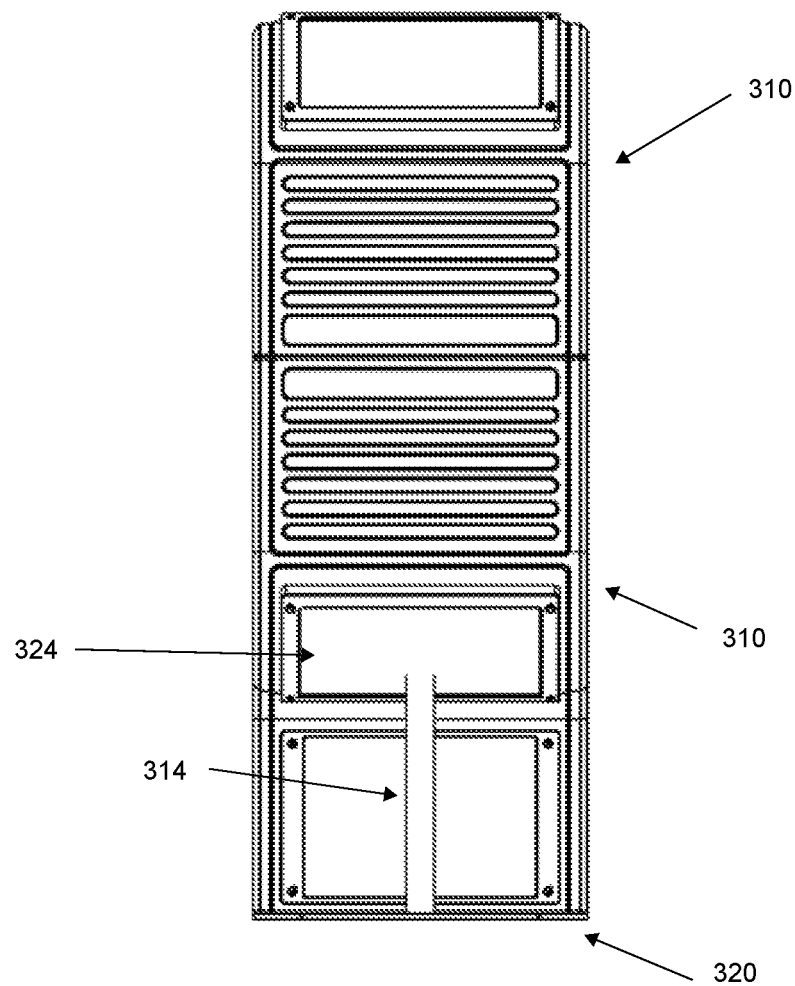
FIGURE 3.C.

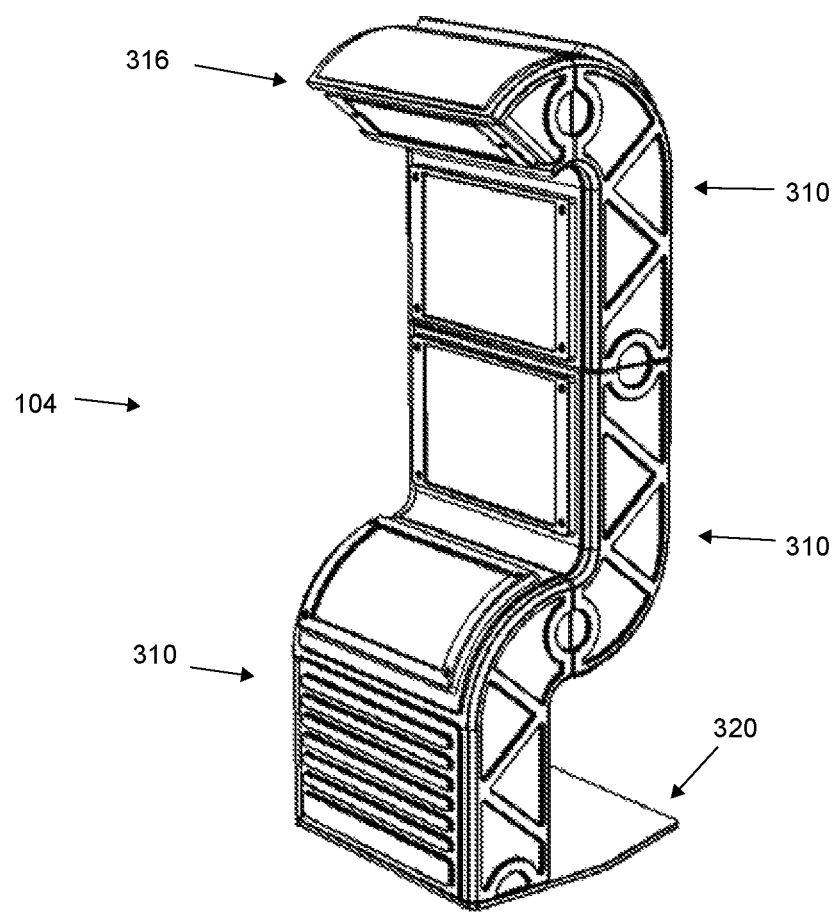
FIGURE 3.D.

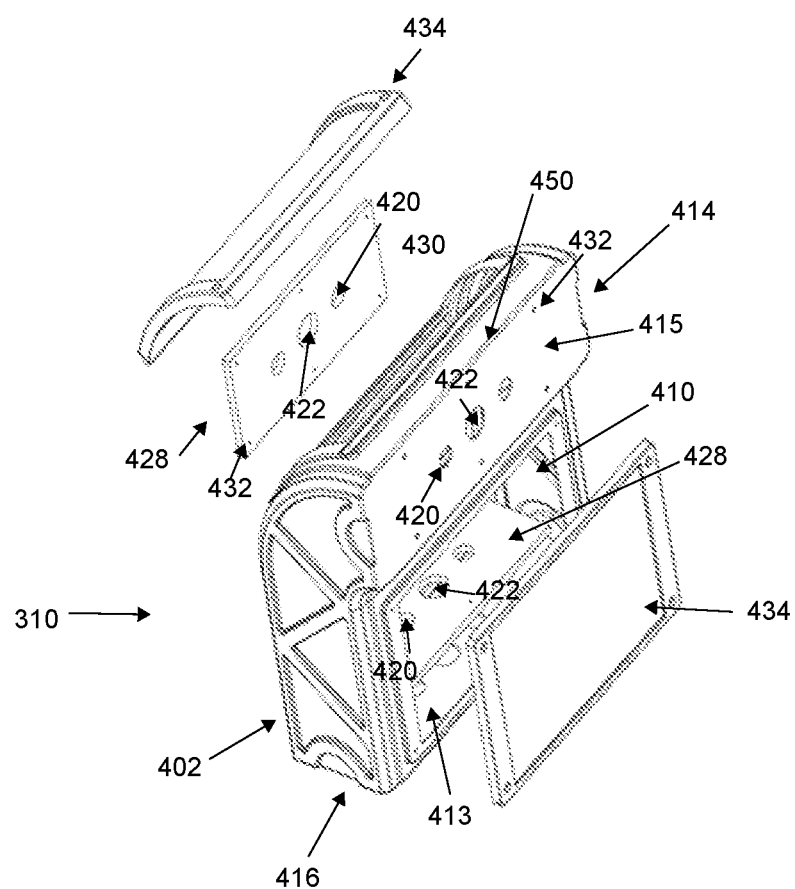
FIGURE 4.A.

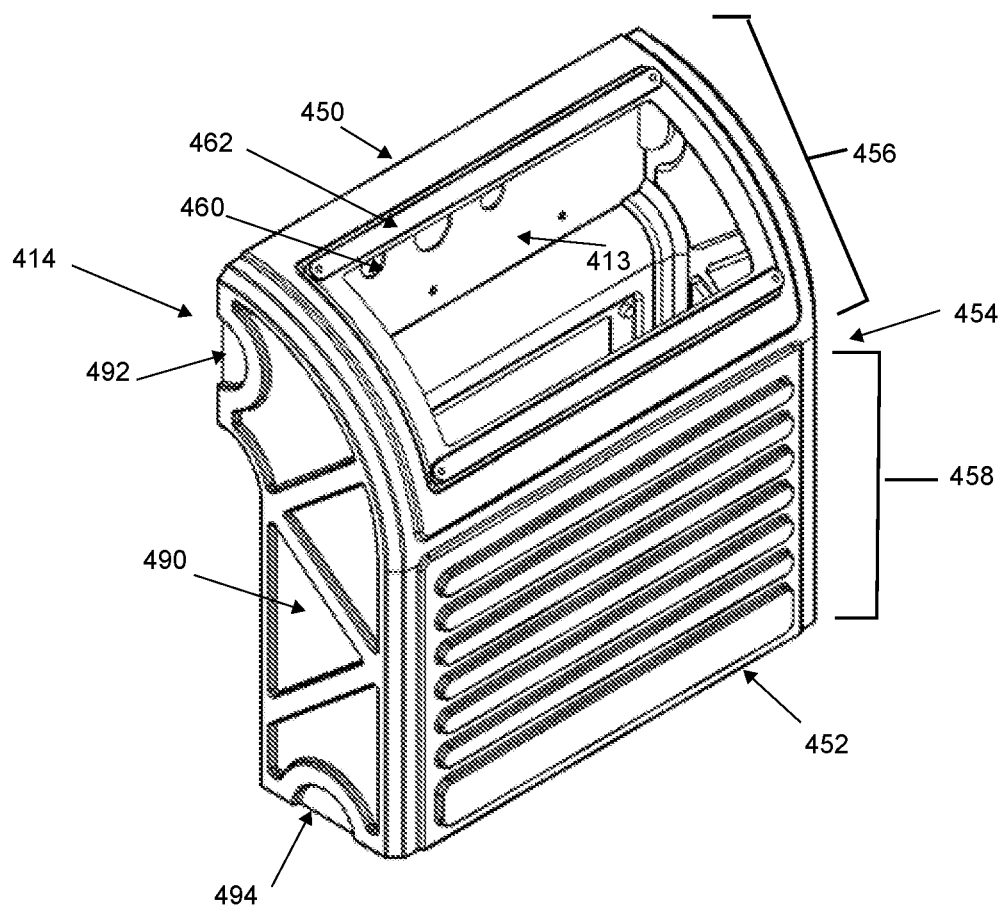
FIGURE 4.B.

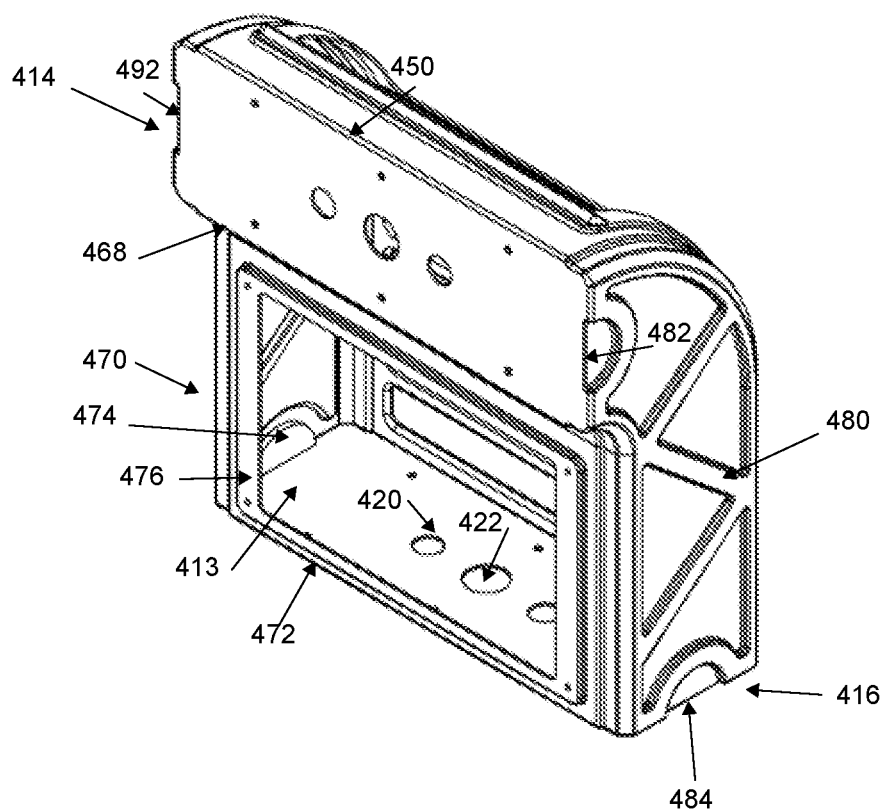
FIGURE 4.C.

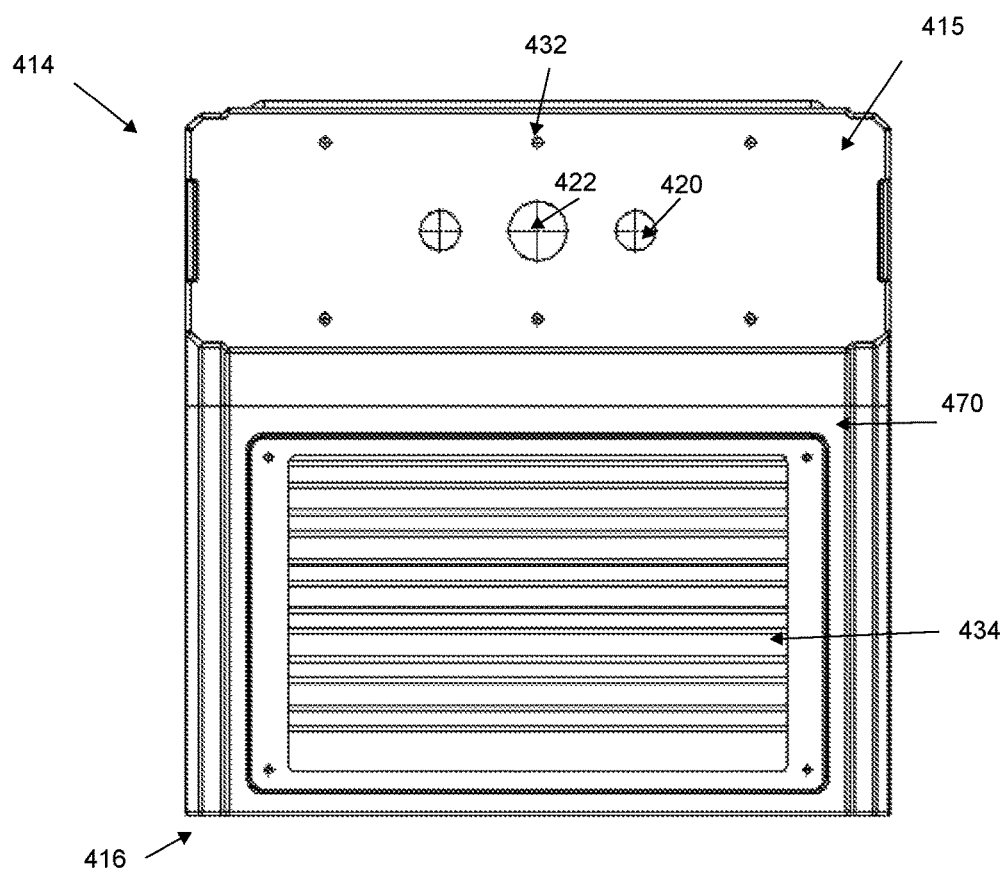
FIGURE 4.D.

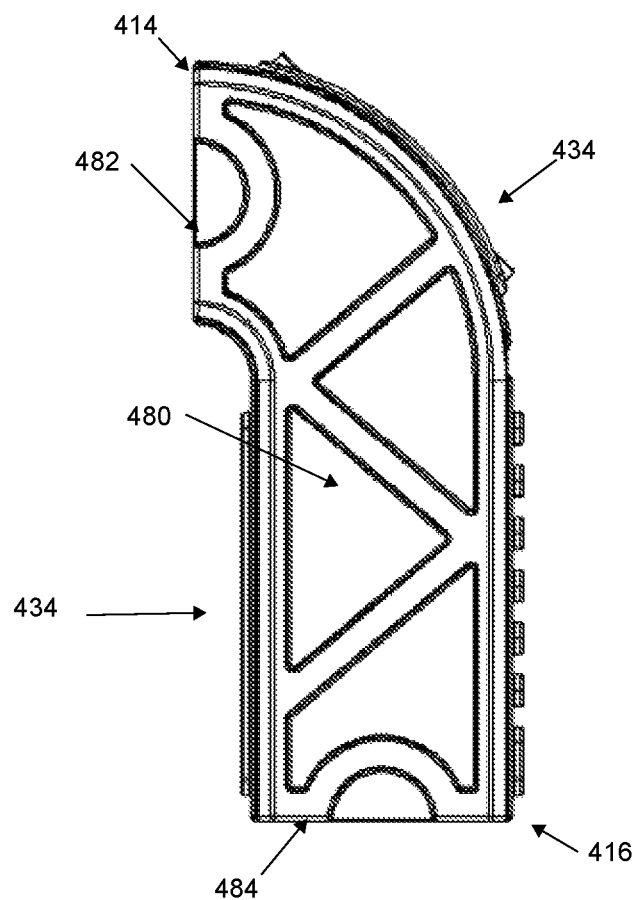
FIGURE 4.E

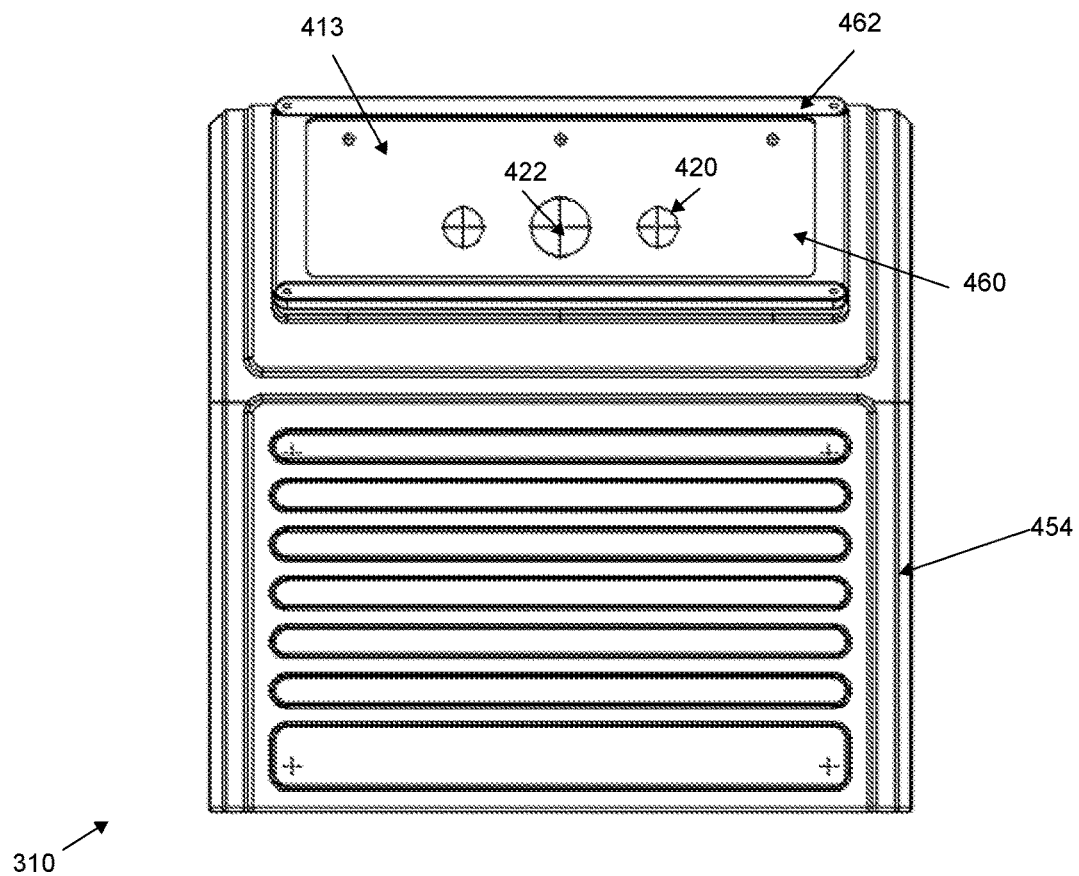
FIGURE 4.F.

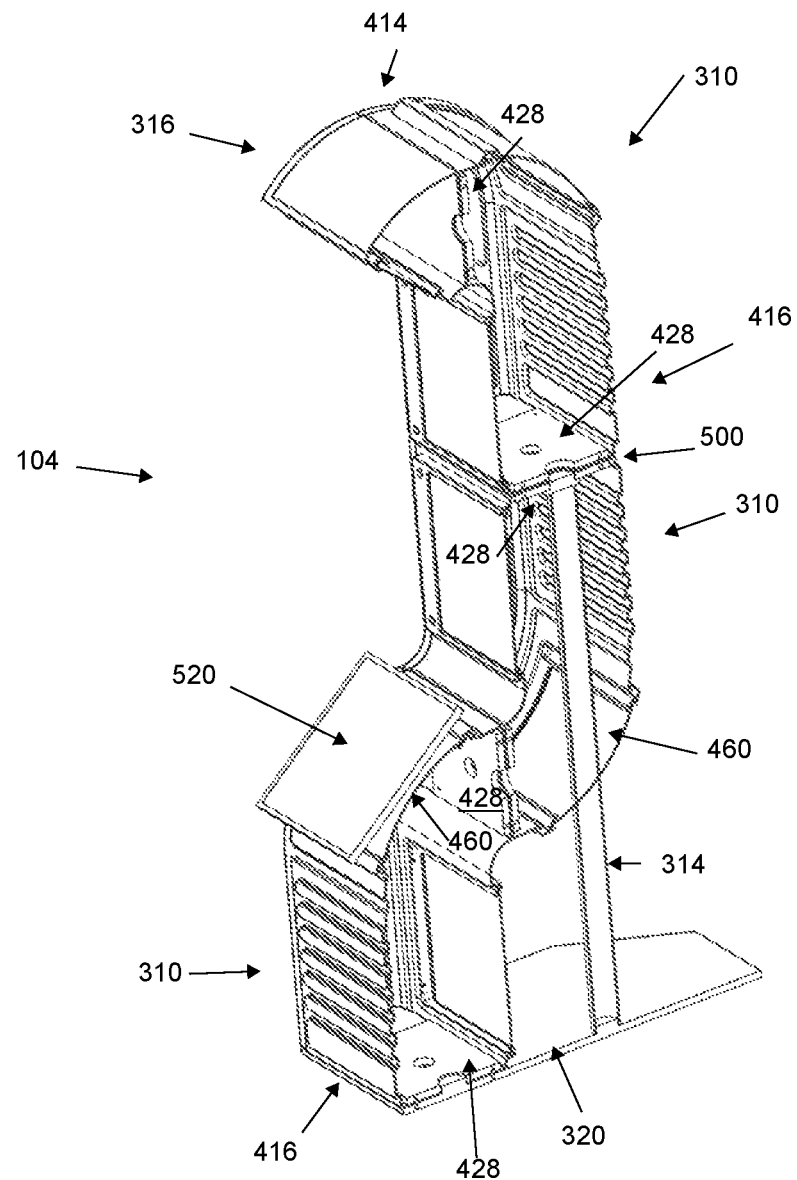
FIGURE 5.A.

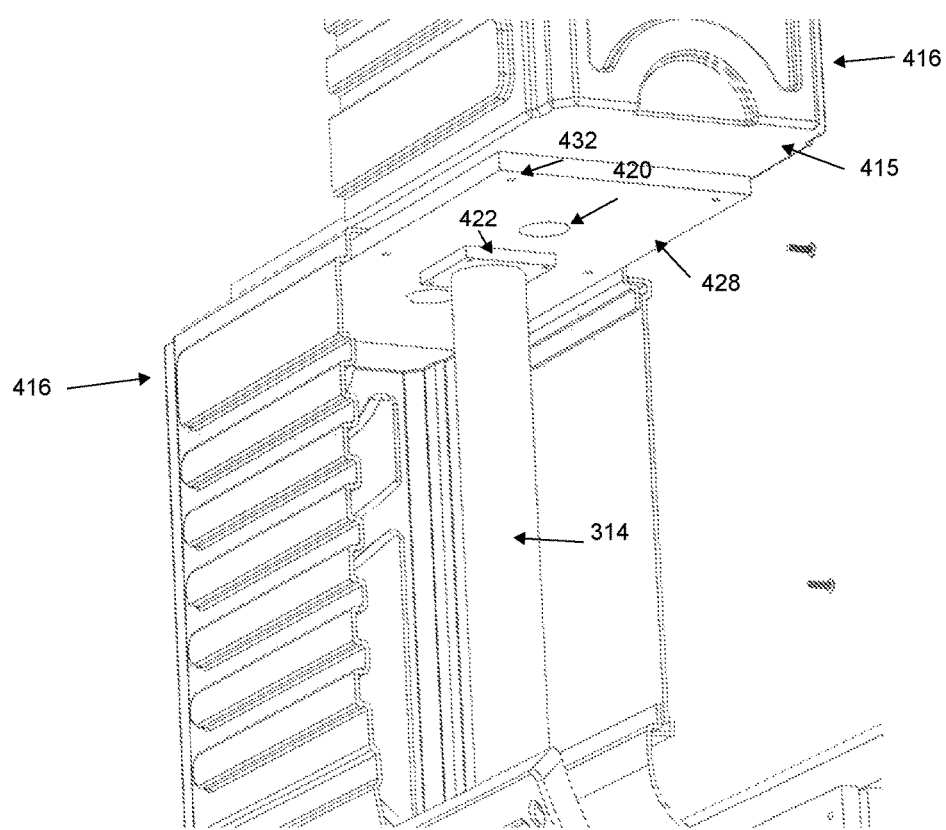
FIG. 5.B.

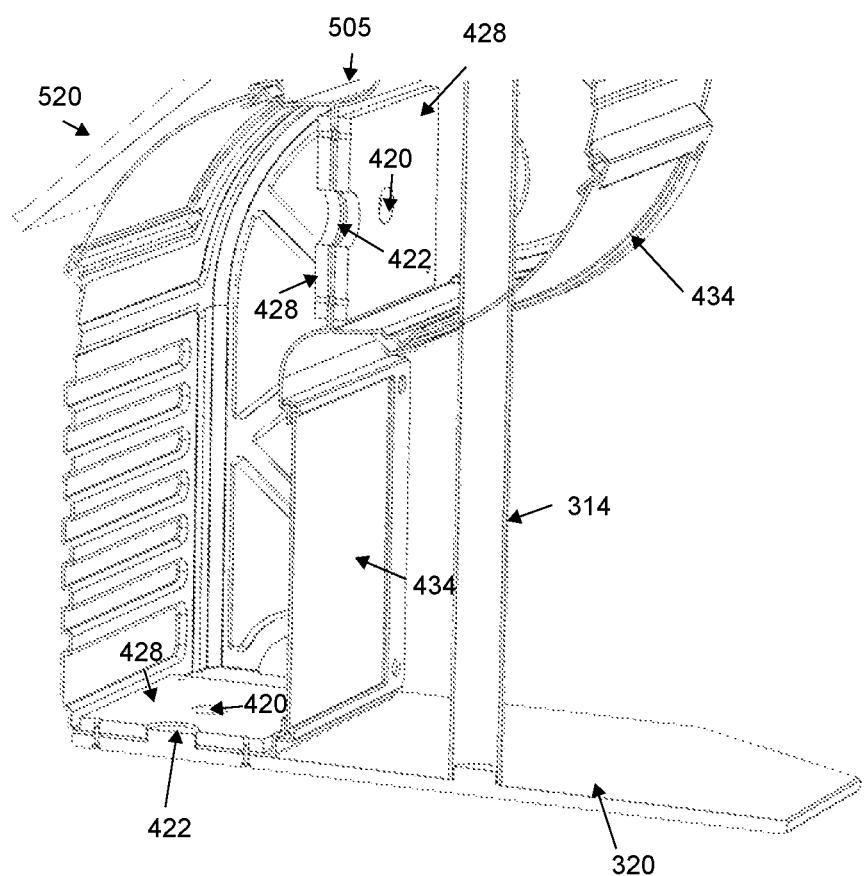
FIG 5.C.

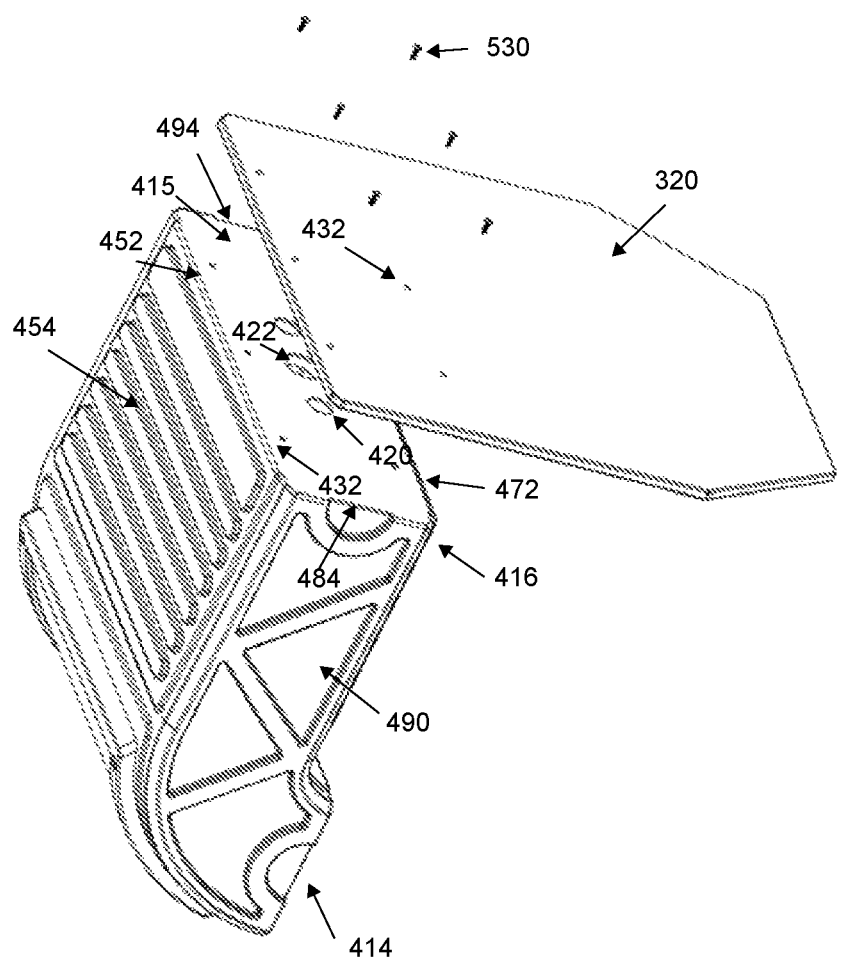
FIGURE 5.D.

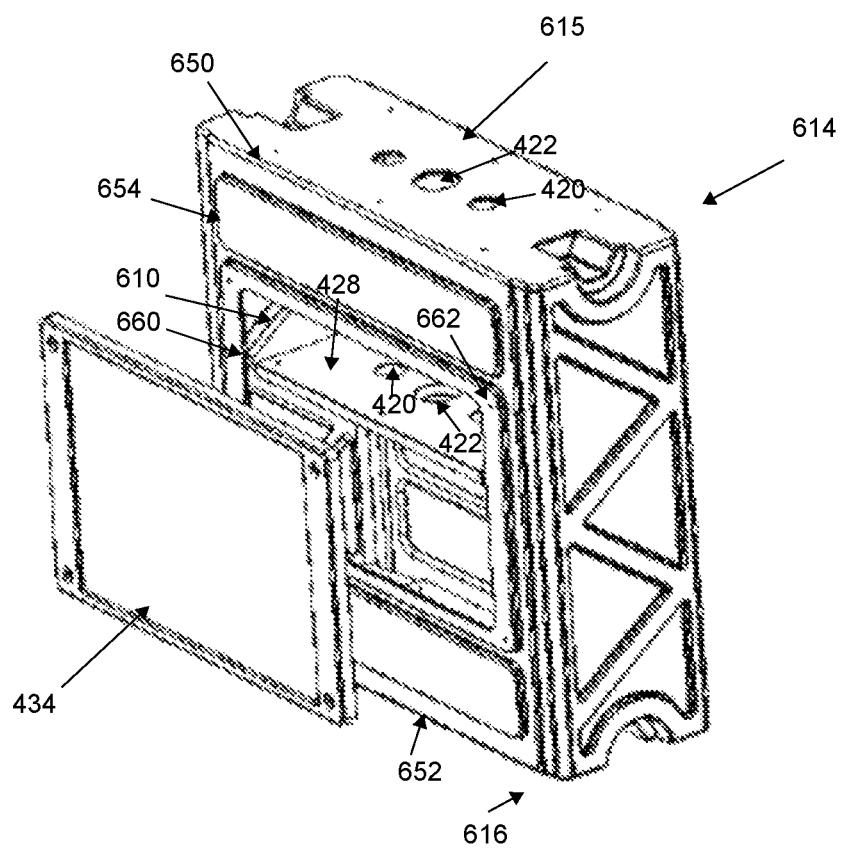
FIGURE 6.A.

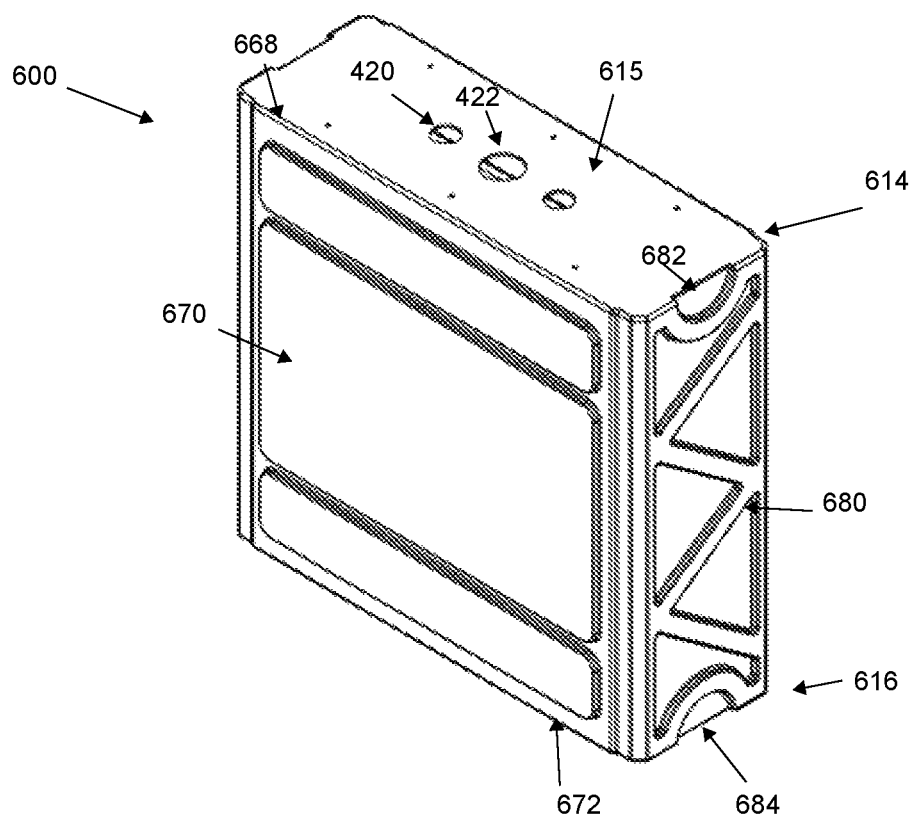
FIGURE 6.B.

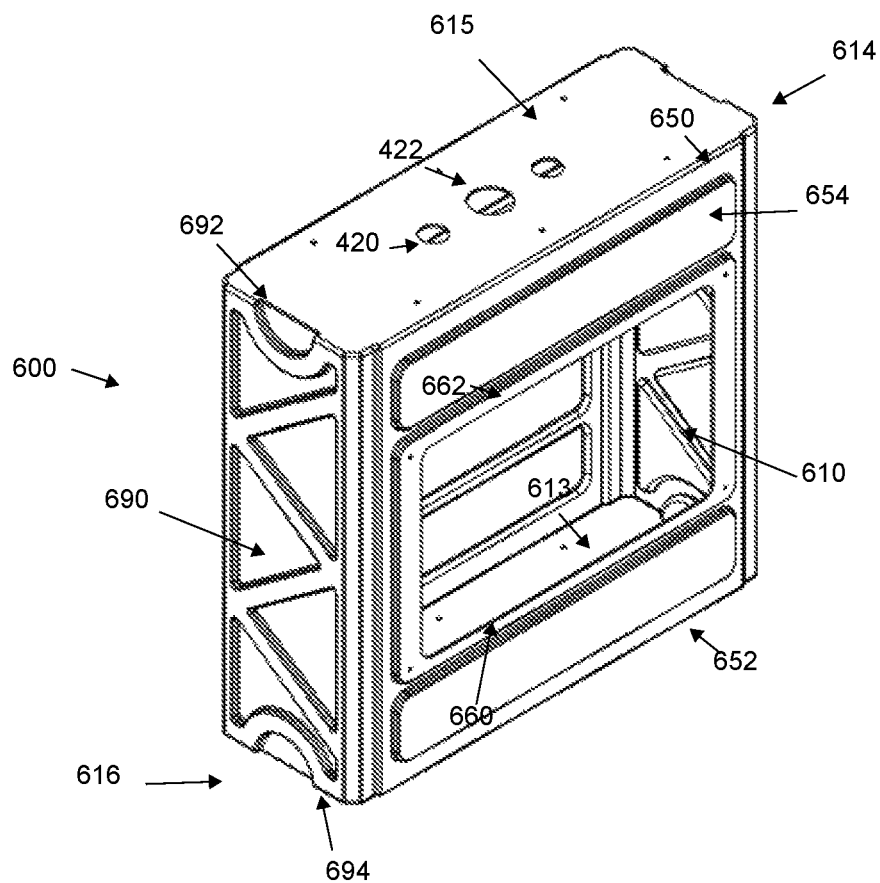
FIGURE 6.C

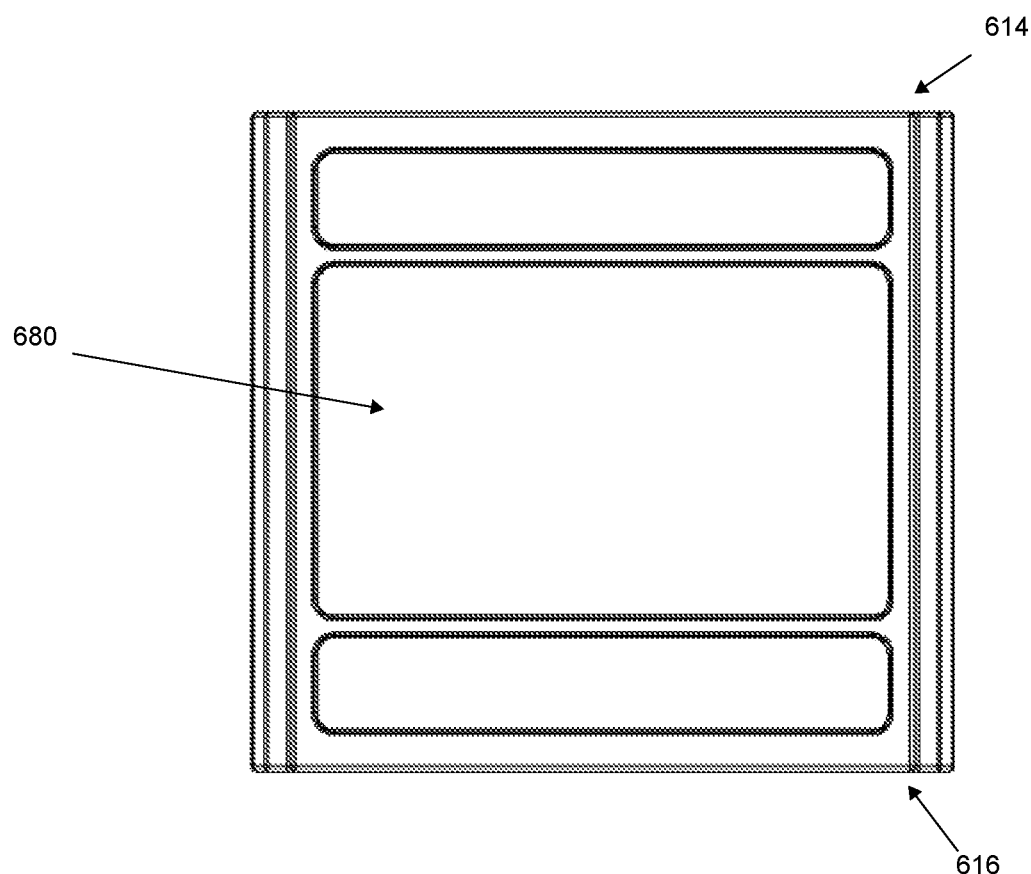
FIGURE 6.D.

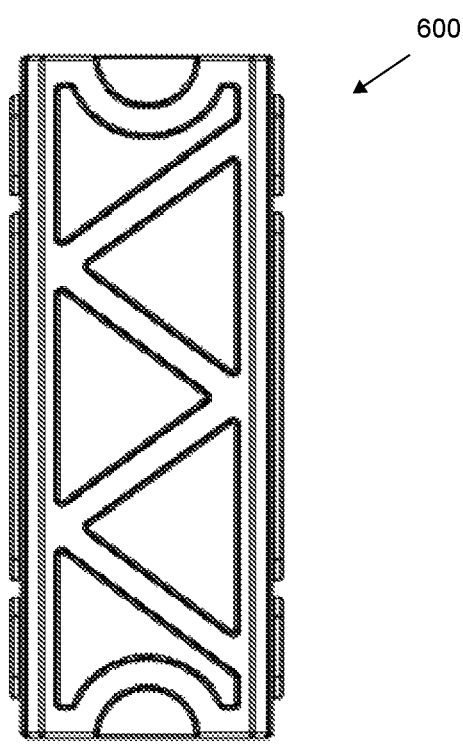
FIGURE 6.E.

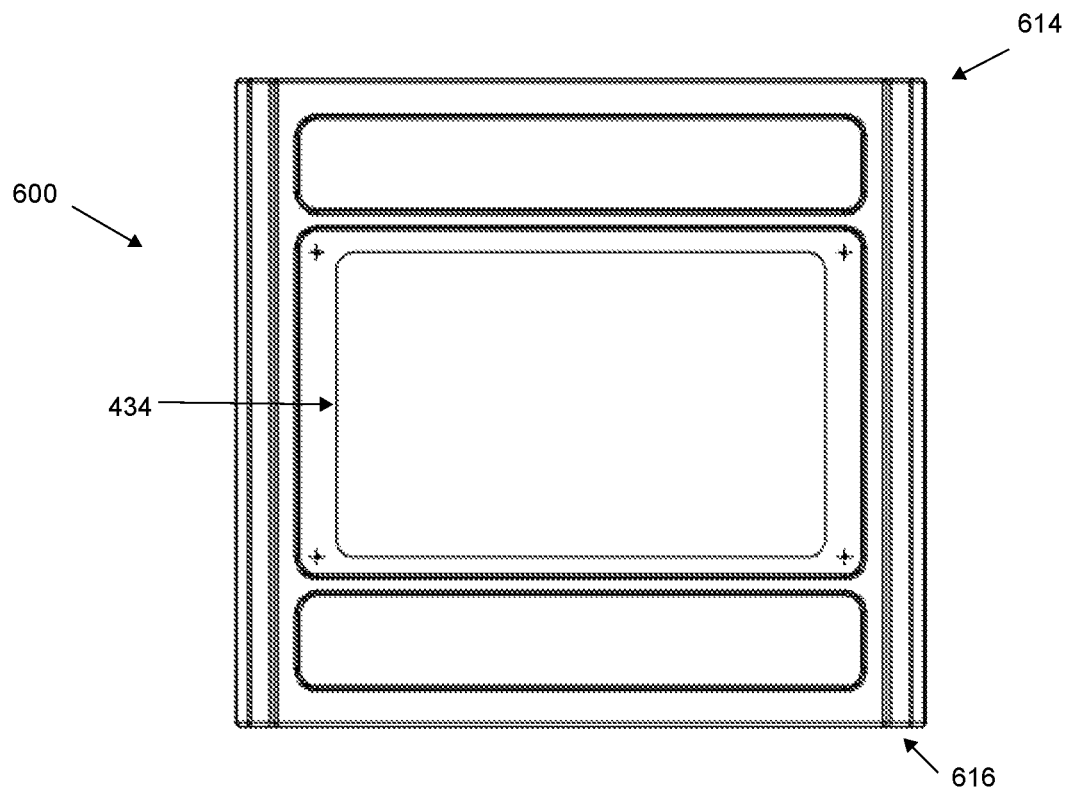
FIGURE 6.F.

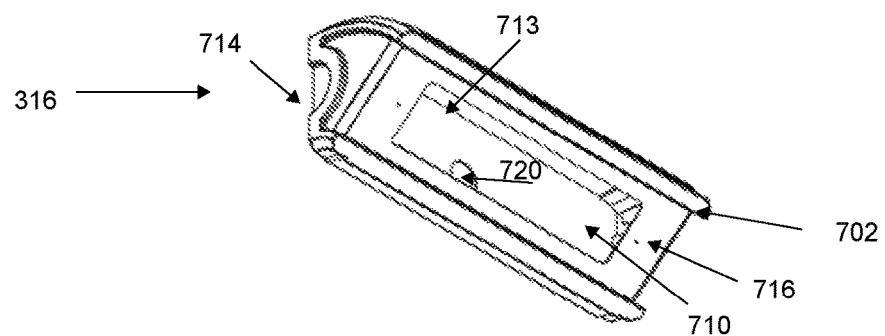
FIGURE 7.A.
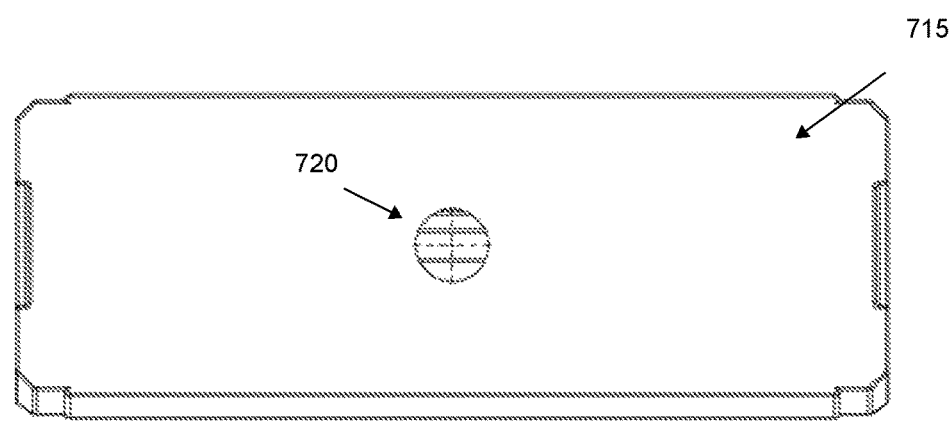
FIGURE 7.B.

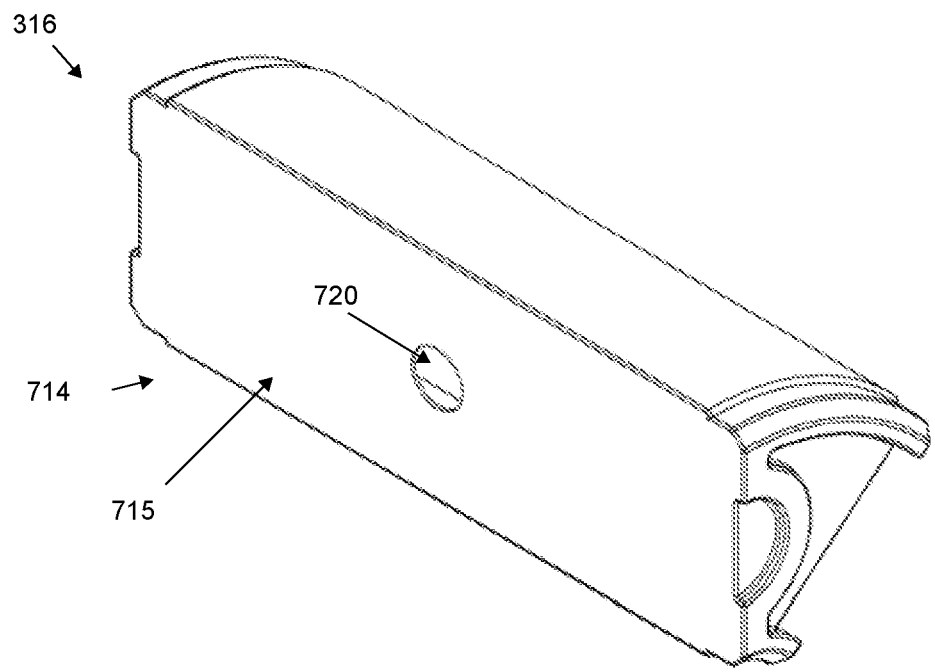
FIGURE 7.C.

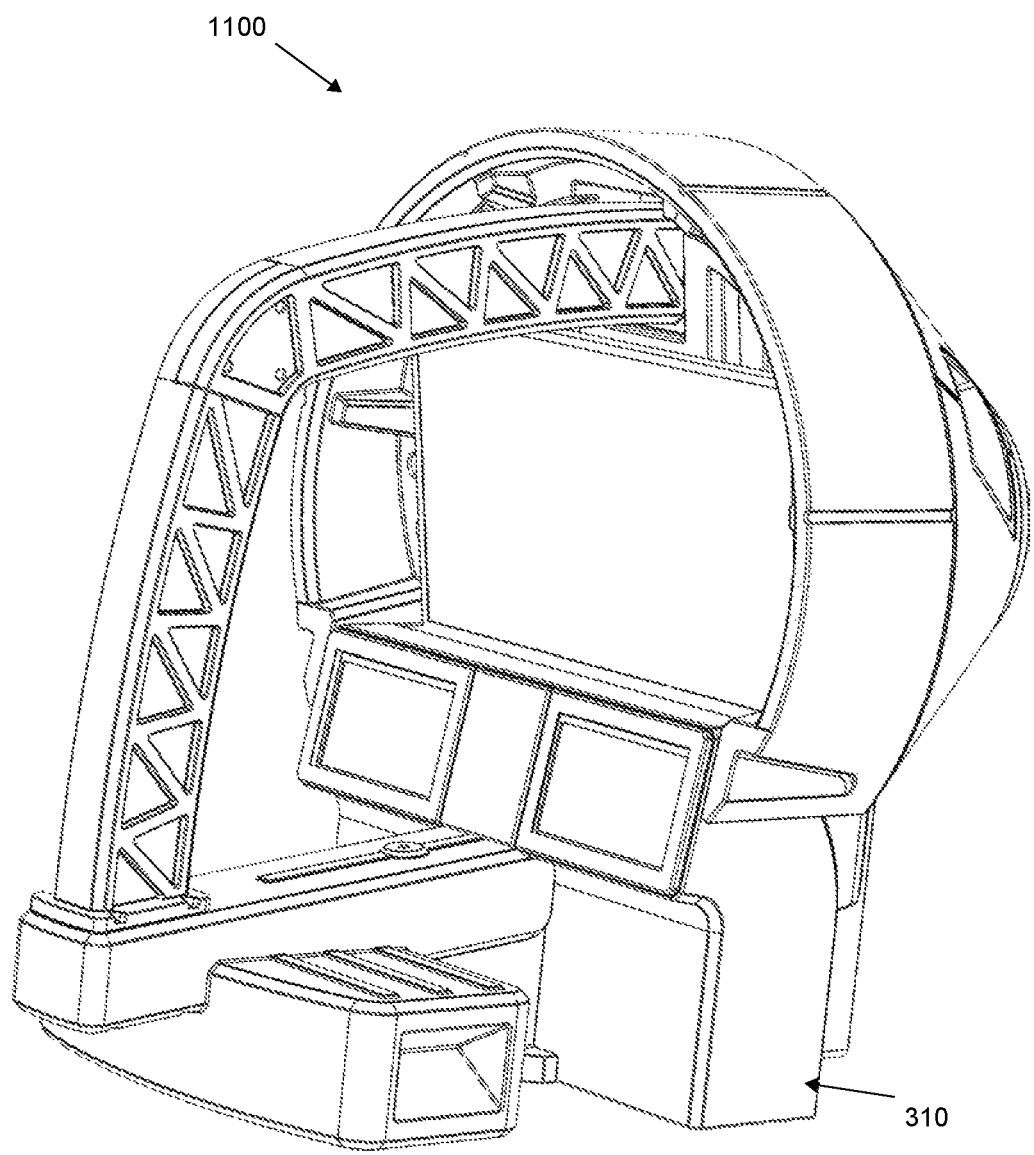
FIGURE 11.A.

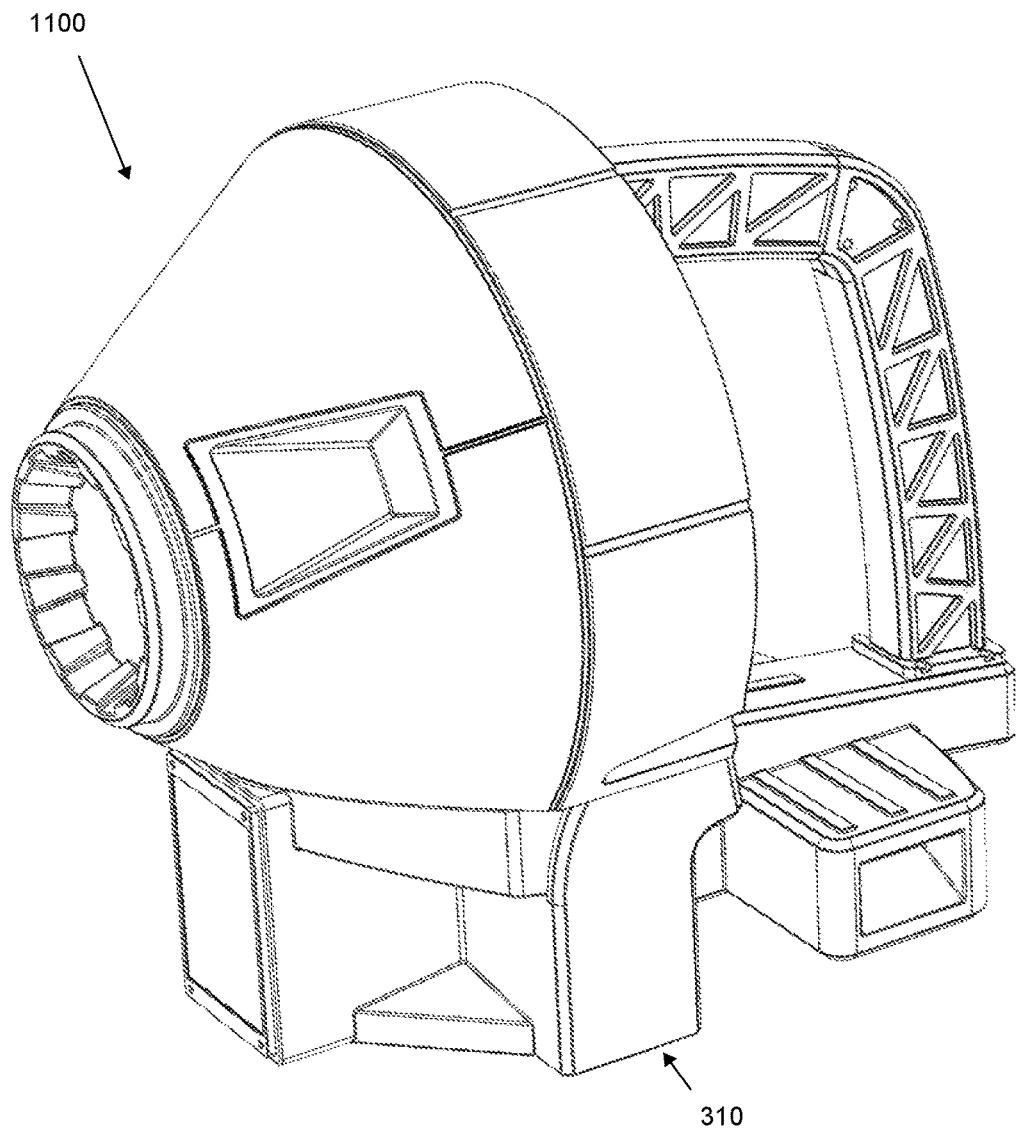
FIGURE 11.B.

METHOD SYSTEM AND KIT FOR PRODUCING INFORMATIONAL EXHIBITS

RELATED APPLICATIONS

The present patent document is a continuation of application Ser. No. 14/948,923, filed Nov. 23, 2015, now U.S. Pat. No. 9,526,332, which is a continuation of application Ser. No. 14/578,462, filed Dec. 21, 2014, now U.S. Pat. No. 9,198,306, which claims the benefit of the filing date under 35 U.S.C. §119(e) of Provisional U.S. Patent Application Ser. No. 61/919,777, filed Dec. 22, 2013. All of the foregoing applications are hereby incorporated by reference in their entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Museums serve a critical pedagogical role. They provide a tangible educational medium of teaching through display and experience. To date, museum exhibits have been prepared to accurately depict subjects. For example but not limited to natural history, science, world history, and etc.

Museum exhibits are constructed on site taking into account the characteristics of pre-existing space. In the past, exhibit creation involved, a variety of manufacturing techniques including cabinet making, metal work, fiberglass, and other more traditional construction methods. Some custom work is generally included as well, but the goal is almost without exception to produce a one-off product. There are occasions where a successful exhibition may have multiple copies, but copy two would usually require approximately the same outlay of time, money, and effort to produce. Another limitation of traditional exhibit manufacturing techniques and design philosophy is the creation of fairly rigid structures with inflexible layout and assembly. This one-size-fits-all approach often means that a number of museums and other host venues simply cannot accommodate the exhibition due to limitations in the size of shape of their exhibit hall. Ultimately this denies the public opportunities to see and experience what might otherwise be very impactful educational content.

BRIEF SUMMARY

We disclose a method, system, and kit for producing informational exhibits.

BRIEF DESCRIPTION OF THE DRAWINGS

FIG. 3.A. is a side view of a kiosk.
FIG. 3.B. is a front view of a kiosk.
FIG. 3.C. is a back view of a kiosk.
FIG. 3.D. is a side perspective view of a kiosk.
FIG. 4.A. is a perspective view of a first component system.
FIG. 4.B. is a first perspective view of a first component.
FIG. 4.C. is a second perspective view of a first component.
FIG. 4.D. is a first elevational view of a first component.
FIG. 4.E. is a side elevational view of a first component.
FIG. 4.F. is a second elevational view of a first component.
FIG. 5.A. is a cross-section perspective view of a kiosk.
FIG. 5.B. is a cross-section cut-away view of a first junction.
FIG. 5.C. is a cross-section cut-away view of a second junction.
FIG. 5.D. is a perspective view of a second component system.
FIG. 6.A. is a perspective view of a third component system.
FIG. 6.B. is a first perspective view of a second component.
FIG. 6.C. is a second perspective view of a second component.
FIG. 6.D. is a first elevational view of a second component.
FIG. 6.E. is a first side view of a second component.
FIG. 6. F. is a second elevational view of a second component.
FIG. 7.A. is a first perspective view of a third component.
FIG. 7.B. is a first elevational view of a third component.
FIG. 7.C. is a second perspective view of a third component.
FIG. 11.A. view of a capsule made of components.
FIG. 11.B. is a view of a capsule made of components.

DETAILED DESCRIPTION OF THE DRAWINGS

Figure 1:
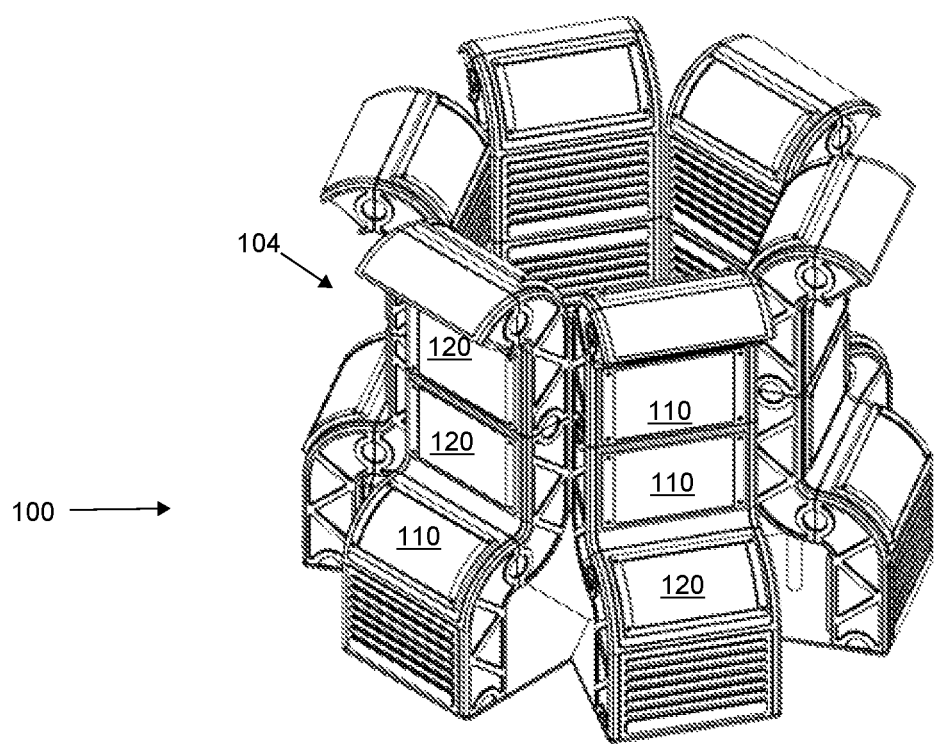
FIG. 1 is a perspective view of an exemplary exhibit.

We provide a system of modular components used to build structures that are easily assembled and disassembled. The system may be capable of assembly and disassembly by even unskilled laborers. The system may be used to build permanent structures and/or temporary structures. The structures may be set up and/or taken down with simple tools, and without creating much, if any, dust, debris, or excessive noise. The modular components may be lightweight, easy to transport, and may require far less cargo space which may decrease fuel requirements and therefore decrease the environmental impact of the system as compared to traditional structural elements. Furthermore, the modular components are adapted for easily on-site assembly, which may decrease the time between conception and installation. The elements of the system are re-usable, allowing for decreased environmental impact by decreasing waste as compared to traditional structures, which, being largely unusable, are largely disposed of in non-sustainable manner.

Modular components may be partially or fully constructed at a factory by rotomolding, pre-assembly of certain standardized components, and insertion of a wide variety of lighting, electrical, or other electronic elements to provide multi-media content. These components can be transported via train, truck, ship, or otherwise to an exhibition site for final assembly into complete structures.

Currently, exhibitions are largely tailored to each space and do not allow for easy disassembly. By contrast, the disclosed system allows for easy disassembly so the modular components may be segregated into component parts and/or reused for constructing new structures, new informational exhibits, and otherwise, when the original structure is no longer needed. By contrast, currently known methods of creating informational exhibits are wasted because, among other things, they cannot be disassembled without being damaged or destroyed. Furthermore, they cannot be easily reused and often cannot be transformed to a different exhibition experience.

In one variation, the system may be used to produce informational exhibits. An informational exhibit may include a display or group of displays put out in a public place for people to view and interact. Examples of venues for informational exhibits include but are not limited to science centers, natural history museums, airport museums, traveling exhibitions, art museums, history museums, aquariums, mobile museums, zoological parks, botanic gardens, amusement parks, convention centers, office spaces, retail spaces, hospitals, schools, and/or other similar public and/or private spaces that communicate and exhibit things and ideas for the purpose of education, study, research, and/or enjoyment.

Definitions: unless stated to the contrary, for the purpose of the present disclosure the following terms shall have the following definitions:

A reference to "another variation" in describing an example does not imply that the referenced variation is mutually exclusive with another variation unless expressly specified.

The terms "a," "an" and "the" mean "one or more," unless expressly specified otherwise.

The phrase "at least one of" when modifying a plurality of things (such as an enumerate list of things) means any combination of one or more of those things, unless expressly specified otherwise.

The term "e.g." and like terms means "for example, but not limited to" and thus does not limit the term or phrase it explains.

The term "herein" means "in this patent application including anything which may be incorporated by reference," unless otherwise specified.

FIG. 1 provides an exemplary informational exhibit 100. The informational exhibit 100 includes, (among other elements that will be disclosed later), a kiosk 104. In this variation, the informational exhibit 100 includes six kiosks 104. While the kiosks 104 are arranged in a circular formation in FIG. 1, it should be understood that the adaptable nature of the system permits an almost infinite variety of potential arrangements. Each kiosk 104 may have mounted therein visual displays 110. The visual display 110 may include a computer monitor or other analog or digital item that displays information, aesthetic aspects, or other visually perceptible information. Each kiosk may have mounted therein interface 120. The interface 120 may be any suitable type of interface, e.g., for programming and information retrieval, e.g., a touch screen, keyboard, or other interactive system. The location of the interface 120 and visual display 110 may be re-arranged to different segments of the kiosk 104.

Figure 2:
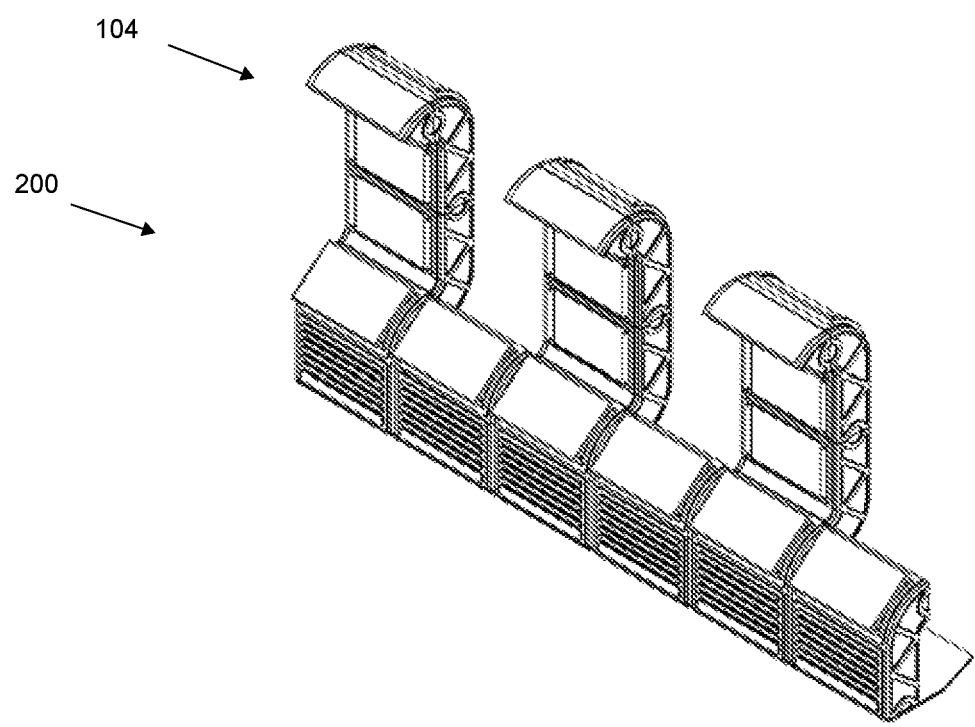
FIG. 2 is a perspective view of a second exemplary exhibit.

This variability is illustrated further by FIG. 2.

FIG. 2 demonstrates a second informational exhibit 200. The informational exhibit 200 includes a linear arrangement of kiosks 104. This FIG. 2, also demonstrates a variability of kiosk formations made possible by the system. For example, FIG. 2 demonstrates that a kiosk 104 may be constructed of more or fewer modular components. For example, tall kiosks and short kiosks. Users may interact with the informational exhibit 100, 200, via the kiosks 104.

FIG. 3.A. demonstrates a kiosk 104. In this example, a kiosk 104 is shown in side view. This figure is merely used to demonstrate the adaptability of the system and is not meant to limit the system to any configuration. The system utilizes multiple versatile components releasably connectable to one another in a variety of connection configurations.

Turning now to FIG. 3.A., the versatile modular components of a modular exhibit system may be connected into the configuration of a kiosk 104. The individual components may be molded such that once a mold is created for any given component; they can be mass-produced at a significantly reduced cost. This may allow for rapid and inexpensive production of exhibit components relative to more traditional methods of exhibit fabrication. Moreover, the components may be configured to meet the needs of host venues of varied types and sizes.

The kiosk 104 may be constructed of one or more J-form components 310. Each J-form component 310 may be reversibly connected to other components, such as but not limited to, other J-form components 310. Multiple components may be reversibly connected at a connection point 312. In this figure, three J-form components 310 are configured to create a kiosk 104.

FIG. 3.A. also illustrates the use of a terminal component 316. Terminal components 316 may create finished ends, e.g., to provide a more finished appearance. FIG. 3 further illustrates the use of a support 314 and a base 320. The support 314 may be a rod, foot, pole, or similar item capable of providing support. The support 314 may pass through the interior of the J-form components.

A cradle 324 may be assembled with a J-form component 310. The cradle 324 may provide structural support. In a variation, the cradle 324 may be a form of hatch (e.g., FIG. 9, 434). In a variation, the support 314 may connect on one end with a base 320 and on the other end with the cradle 324. For example, the support 314 may terminate at the cradle 324. Alternatively or additionally, the support 314 may be a one-piece construction with the cradle 324. In a second variation, the support 314 may pass through the cradle 324. The support 314 may pass through the cradle and continue to pass through the internal section of the kiosk 104.

In this example, three J-form components 310 are connected providing an impressive and sturdy kiosk that may be fitted with internal electronics, internally or externally mounted monitors, interior lighting, and exterior signs as desired.

FIG. 3.B. provides a front view of the kiosk in FIG. 3.A.

FIG. 3.C. provides a back view of the kiosk in FIG. 3.A.

FIG. 3.D. provides a side perspective view of the kiosk in FIG. 3.A. It should be understood that the left side and the right side may be identical.

FIG. 4 illustrates an exemplary J-form component 310. The J-form component 310 may be a J-form hollow component. The J-form component may include a body 402. The body 402 of the J-form component 310 may define a cavity 410. The cavity 410 may refer to the void space within the body 402 of the J-form component 310. The arrow drawn from numeral 410 is directed into the void space within the body 402 to indicate the cavity 410. A J-form component with a cavity 410 may therefore be referred to as a J-form hollow component.

The J-form component 310 may have a first end 414 and a second end 416. The first end 414 may be a wall of the J-form component 310. The first end 414 may be a joining surface for joining the J-form component 310 to other components, and or to support surfaces, walls, floors, or other display items or it may be left unjoined. The first end 414 may have an outer joining surface 415. The outer joining surface 415 may face the space around the outer surface of the J-form component 310. The first end 414 may also include an inner joining surface 413 (shown in FIG. 4.B.). The inner joining surface FIG. 4.B., 413 may face the space within the cavity 410. The first end 414 may have a first horizontal peripheral edge 452, a second horizontal peripheral edge 472, a first vertical peripheral edge 484, and a second vertical peripheral edge 494 (see, e.g., FIG. 5.D.)

The second end 416 may be a joining surface for joining the J-form component 310 to, e.g., other components, support surfaces, walls, floors, other display items, or it may be left unjoined. "Component" and "another component" means a J-form component 310, an I-form component 600, a terminal component 316, and/or a base 320.

The second end 416 may have an outer joining surface (FIG. 5.D., 415) and an inner joining surface 413. The outer joining surface (FIG. 5.D., 415) may face the space around the outer surface of the J-form component 310. The inner joining surface 413 may face the space within the cavity 410. The plane of the first end 414 may be approximately perpendicular to the plane of the second end 416. The second end 416 may have a first horizontal peripheral edge 450, a second horizontal peripheral edge 468, a first vertical peripheral edge 482, and a second vertical peripheral edge 492 (see, e.g., FIG. 4.C.).

Turning to FIG. 4.B., a first perspective view of the J-form component 310. The J-form component 310 may have a first sidewall 454 extending between a first horizontal peripheral edge 450 of the first end 414 and a first horizontal peripheral edge 452 of the second end 416. The first sidewall 454 may have a curved shape, approximating the shape of the letter "J." The first sidewall 454 may have a curved region 456 and a linear region 458. The curved region 456 of the first side-wall 454 may have a window opening 460 defined therethrough. The window opening 460 may be assembled with a frame 462. The window opening 460 and/or the frame 462 may be capable of reversibly assembling with a hatch FIG. 4.A., 434.

Turning to FIG. 4.C., a second perspective view of the J-form component 310. The J-form component 310 may have a second sidewall 470 extending between a second horizontal peripheral edge 468 of the first end 414 and a second horizontal peripheral edge 472 of the second end 416. The second sidewall 470 may have a window opening 474. The window opening may be assembled with a frame 476. The window opening 474 and/or the frame 476 may be capable of reversibly assembling with a hatch FIG. 4.A., 434.

The J-form component 310 may have a third side-wall 480 extending from a first vertical peripheral edge 482 of the first end 414 and a first vertical peripheral edge 484 of the second end 416. The third side-wall 480 may be J-form.

The J-form component 310 may have a fourth side-wall 490 extending between a second vertical peripheral edge 492 of the first end 414 and a second vertical peripheral edge 494 of the second end 416. The fourth side-wall 490 wall may be approximately J-form.

Turning back to FIG. 4.A., the first end 414 may define openings that pass through the outer joining surface 415 and the inner joining surface 413 (FIG. 4.B. 413). The openings may permit passage of items, e.g., cabling (e.g., cords, wires, cables), power devices, structural components, or otherwise. The opening may also permit ventilation into and/or out of the component.

The first end 414 may define a conduit opening 420 therethrough. The conduit opening 420 may permit passage of cabling (e.g., cords, wires, cables), power devices, structural components, computer components, or otherwise. The location and relative size of the conduit opening 420 may vary from the example shown in FIG. 4.A. The first end 414 may define a support opening 422 therethrough. The support opening 422 may provide passage for, e.g., a support FIG. 3.A., 314. The support FIG. 3.A., 314 may be, e.g., a pole, a bar, a pipe, a leg, or similar.

Turning to FIG. 4.C., the second end 416 may define openings that pass through the outer joining surface (FIG. 5.D., 415) and the inner joining surface 413. The openings may permit passage of items, e.g., cabling (e.g., cords, wires, cables), power devices, structural components, or otherwise. The opening may also permit ventilation into and/or out of the component.

The second end 416 may define a conduit opening 420 there through. The conduit opening 420 may permit passage of cords, wires, power devices, structural components, computer components, or otherwise. The location and relative size of the conduit opening 420 may vary from the example shown in FIG. 4.A. The first end 414 may define a support opening 422 there through. The support opening 422 may provide passage for, e.g., a support FIG. 3.A., 314. The support FIG. 3.A., 314 may be, e.g., a pole, a bar, a pipe, a leg, or similar.

Turning to FIG. 4.A., the system, e.g., modular exhibit system, may include a plate 428. The plate 428 may serve as, for example but not limited to, a mounting plate. A mounting plate may assist the assembly of components to other components and/or to other structural items including walls, floors, peripheral items, and similar. FIG. 4.A. demonstrates how a plate 428 may be configured to be positioned within the cavity 410 of the J-form component 310. The plate 428 may be removable. The plate 428 may be configured to be positioned within the cavity 410 of the J-form component 310. The plate 428 may align with the inner joining surface 413 of the first end 414 or the second end 416. The plate 428 may provide structural integrity at the joining surfaces.

In a variation, the plate 428 may have openings that pass completely through the plate 428. The openings may permit passage of items, e.g., cords, wires, power devices, structural components, or otherwise. The opening may also permit ventilation into and/or out of the component. The openings in the plate 428 may correspond to the openings in the joining surfaces of the first end 414 and/or the second end 416. For example, the plate 428 may define a conduit opening 420 therethrough. The conduit opening 420 may permit passage of cords, wires, power devices, structural components, computer components, or otherwise. The location and relative size of the conduit opening 420 may vary from the example shown in the figures. The plate 428 may define a support opening 422 therethrough. The support opening 422 may provide passage for, e.g., a support FIG. 3.A., 314. The support FIG. 3.A., 314 may be, e.g., a pole, a bar, a pipe, a leg, or similar.

The plate 428 may align with, for example, an outer joining surface 415 of a first end 414 of a first J-form component 310 and the inner joining surface 413 of the second end 416 of a second J-form component 310. The plate 428 may facilitate connection between a J-form components 310 and a second component, including but not limited to another J-form component 310, or an I-form or other component discussed later herein.

The cavity 410 may be dimensioned to enclose, contain, and/or conceal electronic devices, for example but not limited to, power source, transmission cords, power cords, electrical connections, lighting structures, sound emitting devices, light emitting devices, temperature control devices, and etc. Additionally or alternatively, the cavity 410 may be dimensioned to mount interactive electronics such as but not limited to computers, monitors, touch screens, displays, and similar. The contents of the cavity 410 may be accessible via openings, e.g., the window opening FIG. 4.B., 460 of the first side-wall 454 and/or the window opening, FIG. 4.B., 474 of the second side-wall 470. In some variations, the contents of the cavity 410 may be viewable through the window opening, e.g., the window opening FIG. 4.B., 460 of the first side-wall 454 and/or the window opening, FIG. 4.B., 474 of the second side-wall 470.

The cavity 410 may be capable of receiving, enclosing, containing, and/or concealing electrical devices, for example but not limited to, power source, transmission cords, power cords, electrical connections, lighting structures, sound emitting devices, light emitting devices, temperature control devices, and etc. Additionally or alternatively, the cavity 410 may be capable of receiving, enclosing, containing, and/or concealing interactive electronics such as monitors, touch screens, displays, and similar. The contents of the cavity 410 may be accessible via openings, e.g., the window opening FIG. 4.B., 460 of the first side-wall 454 and/or the window opening, FIG. 4.B., 474 of the second side-wall 470.

In an example, multiple J-form components 310 may be joined together to form a structure such as those illustrated throughout the Figures. A plate 428 may be used to facilitate joining at the junctions between the components. For example, one plate 428, which may be a mounting plate, may be used at each end, e.g., the first end 414 and/or the second end 416, of each form to be connected. In another variation, plates 428 can also be firmly connected to walls or other structures. The plate 428 may contain an arrangement of holes, which may include bolt holes 432 that align with the bolt holes 432 on the joining surfaces at the first end 414 and/or the second end 416 of each form (e.g., J-form component 310).

In a variation, the system, e.g., modular exhibit system, may include a hatch 434. A hatch 434 may be dimensioned to reversibly or permanently attach to and cover openings in components, for example, the window opening FIG. 4.B., 460 of the first side-wall 454 and/or the window opening, FIG. 4.B., 474 of the second side-wall 470. A hatch 434 may have multiple designs, examples of which are demonstrated in later drawings. A hatch 434 may be opaque, e.g., to conceal the cavity 410 and/or the contents thereof. Alternatively or additionally, a hatch 434 may be transparent, semi-transparent, or otherwise, e.g., to permit viewing of the cavity 410 and/or contents thereof. For example, a hatch 434, e.g., transparent or semi-transparent, may be desired to display light shows, special effects, or otherwise which may be located in the cavity 410. In further variations, a hatch 434 may include display screens, touch screens, structural attachments for display, poster frames, touch screens, or otherwise.

A hatch 434 may also be molded in a curved or other shape to accommodate variously shapes of openings, for example, the window opening FIG. 4.B., 460 of the first side-wall 454.

FIG. 4.D. provides another perspective of a J-form component. This view illustrates a hatch 434 assembled with the window opening, FIG. 4.B., 474 of the second sidewall 470. It also illustrates a hatch 434 assembled with the window opening FIG. 4.B., 460 of the first sidewall 454. If further shows the J-shape of the sidewall.

FIG. 4.E. provides a side view of a J-form component. This view illustrates a hatch 434 assembled with the window opening, FIG. 4.B., 474 of the second sidewall 470. The J-form component 310 may have a fourth side-wall 490 extending between a second vertical peripheral edge 492 of the first end 414 and a second vertical peripheral edge 494 of the second end 416. The fourth side-wall 490 wall may be approximately J-shaped FIG. 4.F. provides a side view of a J-form component 310. The first sidewall 454 may have a curved region 456 and a linear region 458. The curved region 456 of the first sidewall 454 may have a window opening 460 defined there through. The window opening 460 may be assembled with a frame 462. In this view, the window opening 460 is unexposed providing an unobstructed view of the inner joining surface 413 of the first end 414 of the J-form component 310

FIG. 5.A. provides a cross section of a kiosk 104. The kiosk 104 provides an example of how multiple components, in this example, J-form components 310, may be assembled into an informational exhibit item. A kiosk 104 may be assembled from multiple J-form components 310. Starting at the top of the kiosk 104, we illustrate a J-form component 310 with a first end 414 and a second end 416. The first end is oriented upward. The first end 414 is reversibly assembled with a terminal component 316. Moving down, the second end 416 of the J-form component 310 at the top of the kiosk 104, is reversibly attached to the second end 416 of the J-form component in the middle of the kiosk 104 at a first junction 500. The assembly is facilitated by a plate 428, e.g., a mounting plate. A plate 428 is aligned with the inner joining surface 413 of the second end 416 of the top J-form component 310. Similarly, a plate 428 is aligned with the inner joining surface 413 of the second end 416 of the middle J-form component 310. The two J-form components 310 may be secured by bolts passing through, e.g., from the outer face of the plate 428 of the top J-form component 310, through the wall of the second end 416 of the top J-form component 310, through the wall of the second end 416 of the bottom J-form component 310, and through the plate 428 aligned with the second end of the bottom J-form component 310. In a variation, the bolt may originate and pass also in the opposite direction, from the middle J-form component 310 to the top J-form component 310.

The first end 414 of the middle J-form component 310 assembles to the first end 414 of the bottom J-form component 310. The second end 416 of the bottom J-form component 310 assembles with the base 320. A plate 428, e.g., a mounting plate is positioned within the cavity 410 of the J-form component 310 and aligned with the inner joining surface 413 of the second end 416. The assembly may be secured by, e.g., by bolts passing through the joining second end 416 and the plate 428 to the base 320.

The J-form components 310 may be assembled with a support 314. The support 314 may travel through the cavity 410 of a J-form component 310. For example, the J-form component 310 may enter a window opening 460 of the J-form component 310. The support 314 may assemble with or travel through a support opening 422. The support 314 may continue to pass through one or more assembled components by traveling, e.g., through openings in the components (e.g., conduit openings FIG. 4, 420, support openings FIG. 4, 422, window openings FIG. 4B, 474, FIG. 4.B., 460).

An electronic device 520, such as an interactive screen, display screen, audio-visual device, may be assembled with the kiosk 104. In one example, the electronic device 520 may assemble with the window opening 460, as described elsewhere herein.

FIG. 5.B. is a close-up of the first junction FIG. 5.A., 500. The second end 416 of the top J-form component 310 is reversibly attached to the second end 416 of the middle J-form component 310 at a first junction 500. The assembly is facilitated by a plate 428, e.g., a mounting plate. A plate 428 is aligned with the inner joining surface 413 of the second end 416 of the top J-form component 310. Similarly, a plate 428 is aligned with the inner joining surface 413 (cut away in this FIG. 4.B., therefore not shown) of the second end 416 of the middle J-form component 310. The two J-form components 310 may be secured by bolts passing through, e.g., from the outer face of the plate 428 of the top J-form component 310, through the wall of the second end 416 of the top J-form component 310, through the wall of the second end 416 of the bottom J-form component 310, and through the plate 428 aligned with the second end of the bottom J-form component 310. Of course, the bolt may originate and pass also in the opposite direction, from the middle J-form component 310 to the top J-form component 310. A support 314 is shown assembled through the cavity 410 of a J-form component 310 and assembled at a support opening 422.

FIG. 5.C. is another view in cutaway. The first end 414 of a J-form component 310 is reversibly attached to the first end 414 of another J-form component at a second junction 505. The assembly is facilitated by a plate 428. A plate 428 is aligned with the inner joining surface 413 of the first end 414 of a first J-form component 310. Similarly, a plate 428 is aligned with the inner joining surface 413 (cut away in this FIG. 4.B., therefore not shown) of the first end 414 of another J-form component 310. The two J-form components 310 may be secured by bolts passing through, e.g., from the outer face of the plate 428 of the first J-form component 310, through the wall of the first end 414 of the first J-form component 310, through the wall of the first end 414 of another J-form component 310, and through the plate 428 positioned within the cavity 410 and aligned with the second end of the bottom J-form component 310. Of course, the bolt may originate and pass also in the opposite direction, from the J-form component 310 at the middle of the kiosk 104, to the J-form component 310, at the top of the kiosk 104. A support 314 is shown assembled through the cavity 410 of a J-form component 310 and passing through a window opening 460.

FIG. 5.D. is a close up of the assembly of a J-form component 310 with a base 320. It is meant to enable on of many manners of connecting a component, such as a J-form component 310 to a base 320. A base 320 may include bolts 530 which may correspond to bolt holes, e.g., bolt holes 432 in a plate 428 and/or bolt holes 432 in a base 320. The base 320 may be reversibly or permanently attached to a J-form component 310, I-form component, FIG. 6, 610 or otherwise, via connection through a plate 428 or directly, e.g., through a surface (e.g., outer joining surface 415 and inner joining surface FIG. 4.A., 413).

FIG. 6.A. illustrates an exemplary I-form component 600. The I-form component 600 may be an I-form hollow component. The I-form component may include a body. The body of the I-form component 600 may define a cavity 610. The cavity 610 may refer to the void space within the body of the I-form component 600. The arrow drawn from numeral 610 is directed into the void space within the body to indicate the cavity 610. A I-form component 600 with a cavity 610 may therefore be referred to as a I-form hollow component The I-form component 600 may have a first end 614 and a second end 616. The first end 614 may be a wall of the I-form component 600. The first end 614 may be a joining surface for joining the I-form component 600 to other components, and or to support surfaces, walls, floors, or other display items or it may be left unjoined. The first end 614 may have an outer joining surface 615. The outer joining surface 615 may face the space around the outer surface of the I-form component 600. The first end 614 may also include an inner joining surface 613 (shown in FIG. 6.C.). The inner joining surface FIG. 6.C., 613 may face the space within the cavity 610.

The second end 616 may be a joining surface for joining the I-form component 600 to, e.g., other components, support surfaces, walls, floors, other display items, or it may be left unjoined. The second end 616 may have an outer joining surface 615 and an inner joining surface FIG. 6.B. 613. The outer joining surface 615 may face the space around the outer surface of the I-form component 600. The inner joining surface 613 may face the space within the cavity 610. The plane of the first end 614 may be approximately parallel to the plane of the second end 616. The first end 614 of the I-form component 600 may be structurally identical to the second end 616 of the I-form component 600.

The I-form component 600 may have a first sidewall 654 extending between a first horizontal peripheral edge 650 of the first end 614 and a first horizontal peripheral edge 652 of the second end 616. The first sidewall 654 may be substantially planar in shape, approximating the shape of the letter "I." The first sidewall 654 may have a window opening 660 defined there through. The window opening 660 may be assembled with a frame 662. The window opening 660 and/or the frame 662 may be capable of reversibly assembling with a hatch 434.

The first end 614 may define openings that pass through the outer joining surface 615 and the inner joining surface 613 (FIG. 6.C. 613). The openings may permit passage of items, e.g., cords, wires, power devices, structural components, or otherwise. The opening may also permit ventilation into and/or out of the component. The first end 614 may define a conduit opening 420 there through. The conduit opening 420 may permit passage of cords, wires, power devices, structural components, computer components, or otherwise. The location and relative size of the conduit opening 420 may vary from the example shown in FIG. 4.A. The first end 614 may define a support opening 422 there through. The support opening 422 may provide passage for, e.g., a support FIG. 3.A., 314. The support FIG. 3.A., 314 may be, e.g., a pole, a bar, a pipe, a leg, or similar.

The system, e.g. modular exhibit system, may include a plate 428. The plate 428 may serve as, for example but not limited to, a mounting plate. FIG. 4.A. demonstrates how a plate 428 may be configured to be positioned within the cavity 610 of the I-form component 600. The plate 428 may be removable. The plate 428 may be configured to be positioned within the cavity 610 of the I-form component 600. The plate 428 may align with the inner joining surface 613 of the first end 614 or the second end 616. The plate 428 may provide structural integrity at the joining surfaces.

In a variation, the plate 428 may have openings that pass completely through the plate 428. The openings may permit passage of items, e.g., cords, wires, power devices, structural components, or otherwise. The opening may also permit ventilation into and/or out of the component. The openings in the plate 428 may correspond to the openings in the joining surfaces of the first end 614 and/or the second end 616. For example, the plate 428 may define a conduit opening 420 there through. The conduit opening 420 may permit passage of cords, wires, power devices, structural components, computer components, or otherwise. The location and relative size of the conduit opening 420 may vary from the example shown in the figures. The plate 428 may define a support opening 422 there through. The support opening 422 may provide passage for, e.g., a support FIG. 3.A., 314. The support FIG. 3.A., 314 may be, e.g., a pole, a bar, a pipe, a leg, or similar.

The plate 428 may align with, for example, an outer joining surface 615 of a first end 614 of a first I-form component 600 and the inner joining surface 613 of the second end 616 of a second I-form component 600. The plate 428 may facilitate connection between a I-form component 600 and a second component, including but not limited to another I-form component 600 a J-form component 310, or an terminal component 316, a base 320 or otherwise.

The cavity 610 may be dimensioned to enclose, contain, and/or conceal electronic devices, for example but not limited to, power source, transmission cords, power cords, electrical connections, lighting structures, sound emitting devices, light emitting devices, temperature control devices, and etc. Additionally or alternatively, the cavity 610 may be dimensioned to mount interactive electronics such as but not limited to computers, monitors, touch screens, displays, and similar. The contents of the cavity 610 may be accessible via openings, e.g., the window opening 660 of the first side-wall 654. In some variations, the contents of the cavity 610 may be viewable through the window opening, e.g., the window opening 660 of the first side-wall 654.

The cavity 610 may be capable of receiving, enclosing, containing, and/or concealing electrical devices, for example but not limited to, power source, transmission cords, power cords, electrical connections, lighting structures, sound emitting devices, light emitting devices, temperature control devices, and etc. Additionally or alternatively, the cavity 610 may be capable of receiving, enclosing, containing, and/or concealing interactive electronics such as monitors, touch screens, displays, and similar. The contents of the cavity 610 may be accessible via openings, e.g., the window opening 660 of the first side-wall 654.

In a variation, a modular exhibit system may include a hatch 434. A hatch 434 may be dimensioned to reversibly or permanently attach to and cover openings in components, for example, the window opening 660 of the first side-wall 654. A hatch 434 may have multiple designs, examples of which are demonstrated in later drawings. In general, a hatch 434 may be opaque, e.g., to conceal the cavity 610 and/or the contents thereof. Alternatively or additionally, a hatch 434 may be transparent, semi-transparent, or otherwise, e.g., to permit viewing of the cavity 610 and/or contents thereof. For example, a hatch 434, transparent or semi-transparent, may be desired to display light shows, special effects, or otherwise which may be located in the cavity 610. In further variations, a hatch 434 may include display screens, touch screens, structural attachments for display or touch screens, or otherwise.

FIG. 6.B. is a second perspective view of the I-form component 600. The I-form component 600 may have a second sidewall 670 extending between a second horizontal peripheral edge 668 of the first end 614 and a second horizontal peripheral edge 672 of the second end 616.

The I-form component 600 may have a third side-wall 680 extending from a first vertical peripheral edge 682 of the first end 614 and a first vertical peripheral edge 684 of the second end 616.

FIG. 6.C. is a perspective view of the I-form component 600. The I-form component 600 may have a fourth side-wall 690 extending between a second vertical peripheral edge 692 of the first end 614 and a second vertical peripheral edge 694 of the second end 616.

FIGS. 6.D. through 6.E. provide multiple views of an I-form component 600. Including, in FIG. 6.E., the I-form component 600 assembled with a hatch 434.

FIGS. 7.A-7.C. illustrate views of an exemplary terminal component 316 (See also, FIG. 1, 316). A terminal component 316 may be used to cover the outer joining surfaces (surfaces FIG. 4.A., 415, FIG. 6.A., 615) of a unit to give the unit a finished look and/or to facilitate lighting or signage.

Terminal component 316 may include a body. The terminal component 316 may include a display adapter 702. The display adapter 702 may be dimensioned to accommodate displays, signs, hatches, or otherwise. The terminal component 316 may have a cavity 710. The cavity 710 may be dimensioned to enclose, contain, and/or conceal power source, transmission cords, power cords, electrical connections, lighting structures, sound emitting devices, light emitting devices, temperature control devices, and etc. Additionally or alternatively, the cavity 710 may be dimensioned to mount interactive electronics such as monitors, touch screens, displays, audio devices, and similar.

In a variation, the terminal component 316 has a first end 714 and a second end 716. In one variation, the first end 714 may have an outer joining surface 715 and an inner joining surface 713. The second end 716 may have an outer joining surface 715 and an inner joining surface 713.

In a variation, the first end 714 and/or the second end 716 may include openings 720. While one opening 720 is illustrated, any number of openings may be accommodated within the scope of the disclosure. The opening 720 may permit passage of cords, wires, power devices, structural components, or otherwise. The opening 720 may also permit ventilation into and/or out of the component.

A modular exhibit system may include plates 428 (e.g., FIG. 5.A., 428), which may be mounting plates and/or connecting plates. The plates (e.g., FIG. 5.A., 428), may serve as, for example but not limited to, a mounting plate. In a variation, the plate 428 may include openings (e.g., FIG. 5.A., 420, 422). The openings may correspond to the openings 720. The plates 428 may align with, for example, an inner joining surface 713 of an first end 714 of a terminal component 316. The plate 428 may facilitate connection between two components, for example, a terminal component 316 and an I-form component 600, and/or between terminal component 316 and J-form components 310, for example, via bolts, washers, wing nuts, or other connecting devices.

Figure 8:
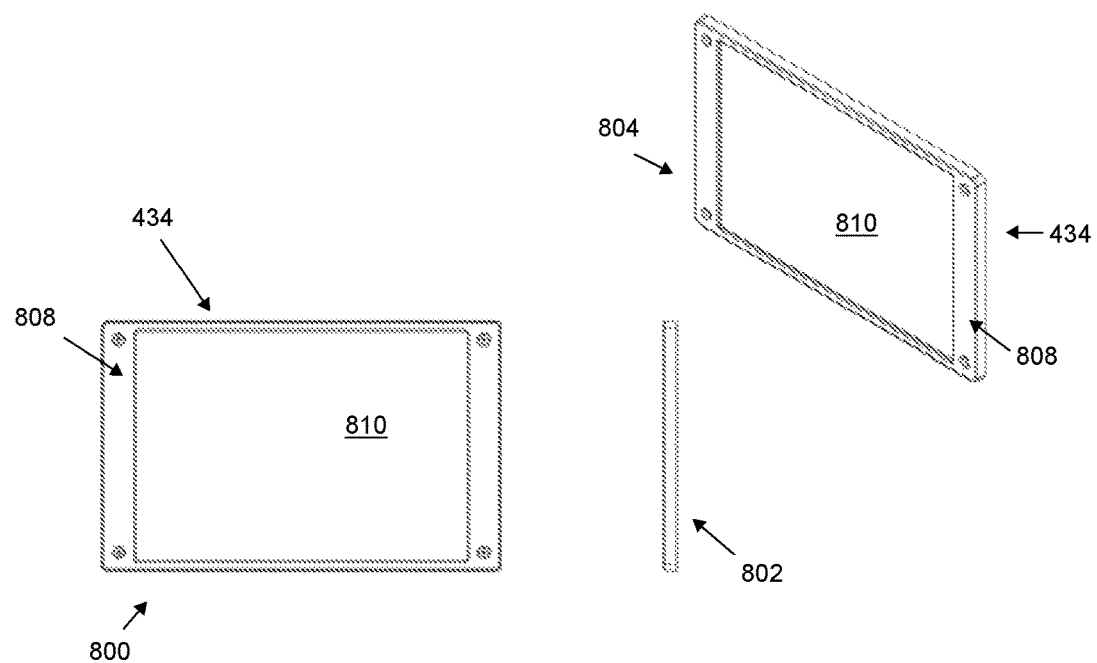
FIG. 8. Provides a hatch.

FIG. 8 provide exemplary hatches 434. The hatch 434 is shown in front view 800, side view 802, and perspective view 804. A hatch 434 may have a frame 808 and a face 810. The frame 808 may facilitate attaching the hatch 434 to a component, for example but not limited to, a J-form component 310, I-form component 600, or terminal component 316.

Figure 9:
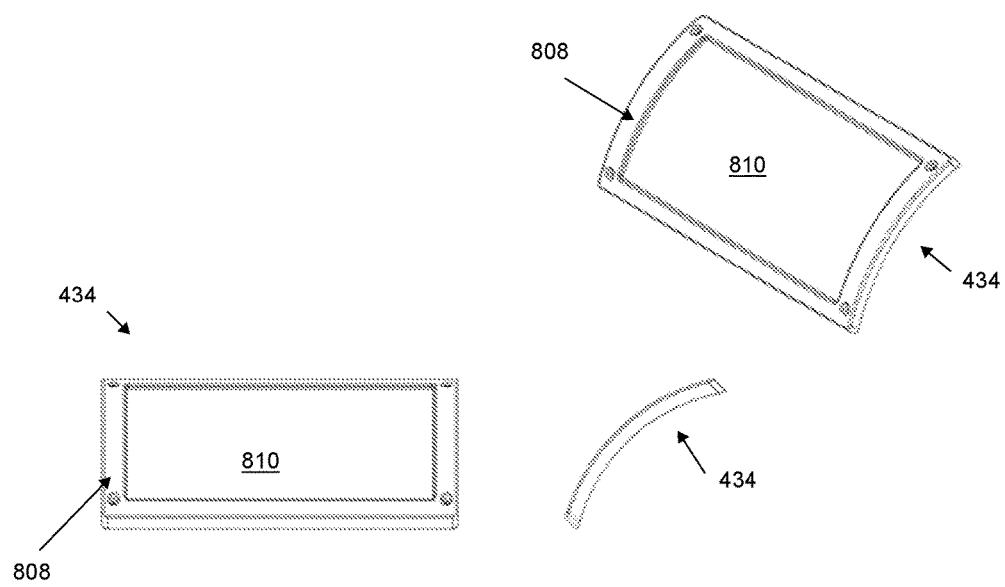
FIG. 9 provides a hatch.

FIG. 9 illustrates a hatch 434 with a curved configuration. The curved configuration may allow the hatch 434 to assembly smoothly over components having curved bodies. For example but not limited to J-form components 310, terminal components 316 or similar. A hatch 434 may have a frame 808 and a face 810. The frame 808 may facilitate assembling the hatch 434 to a component. Hatches may be assembled to component by means known in the art or herein disclosed.

The face 810 of a hatch 434 may be a variety of different surfaces to adapt to the theatrical or functional needs of the informational exhibit. A few non-limiting examples of a surface of a face 810 include, smooth surface, smooth surface for printed drop in sheets (e.g. subway posters), ventilation surfaces, transparent or semi-transparent surfaces, theme relevant designs (e.g., for a control panel kiosk design, may include conduits or controls), LED surface, CRT, LCD, analog or digital computer displays, touch screens, input screens, input devices, and otherwise. Hatches 434 may also include securing devices for larger analog or digital computer displays, input devices, output devices, or exhibited items (e.g., art pieces, pottery pieces, ancient weaponry, etc.).

Figure 10:
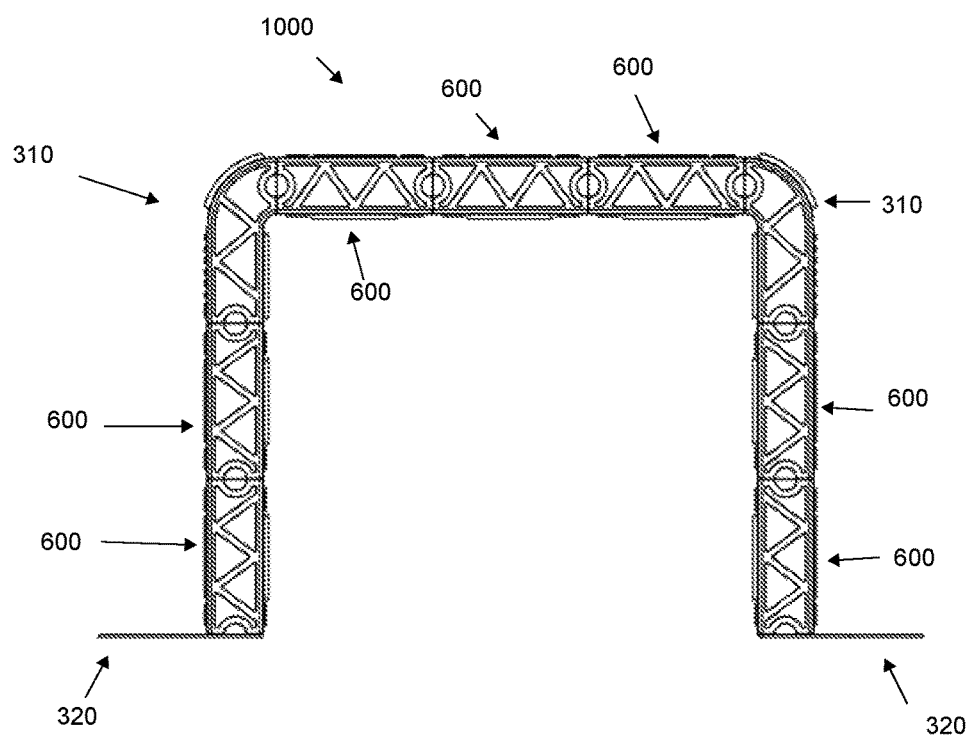
FIG. 10 is a view of an arch made of components.

FIG. 10 provides structure constructed from multiple components into a gate 1000. The gate 1000 is constructed of seven I-form components 600 and two J-form components 310. The I-form component 600 and J-form component 310 may be joined as described and illustrated herein, including as in FIGS. 5.A.-5.C., and the description thereof.

From these illustrations, one can see how multiple forms from kiosks 104 to structural elements such as arches, tunnels, rooms, partitions, inner spaces, and otherwise may be constructed. Each of the variable designs may be deconstructed, easily transported, and reconstructed in the same or different format at another (or the same) site.

FIG. 11 demonstrates how the components may be combined with other construction units to form unique exhibition pieces. In this case, the components are combined with other units to form a capsule assembly 1100. FIG. 11.A. shows a backside perspective view of the capsule assembly 1100. Demonstrating how the use of I-form components 600 and J-form components 310 interact to create a support unit with thematic consistency. The components may facilitate rapid and inexpensive production of exhibit components and may be used to create informational exhibits in museums, zoos, exhibition halls, public spaces, and otherwise. The modular exhibit system provides a safer fabrication and installation process, which may dramatically reduce the use of wood/wood products, acrylic, metal, paints, adhesives, and numerous other hazardous materials relative to traditional exhibit fabrication techniques. As exhibit constructed from the disclosed system may weigh significantly less and be much more space efficient during all phases of production and transport. This may reduce both the number of trucks required for transport and the fuel required to move from one venue to the next.

Broad application of the disclosed system has the potential to substantially multiply the reach and effectiveness of informational exhibits and to simultaneously reduce environmental impact. The exhibit industry currently spends tens if not hundreds of millions of dollars per year to produce, transport, and maintain informational exhibits with traditional methods to produce products that are inherently more expensive, less durable, and often unavailable to facilities in secondary and tertiary markets with smaller or more unusually shaped exhibit spaces.

While various embodiments of the invention have been described, it will be apparent to those of ordinary skill in the art that many more embodiments and implementations are possible that are within the scope of the invention.

The invention claimed is:

1. A modular system comprising:
   a terminal component, comprising:
      a body, the body comprising a cavity; and
      the body comprising a first end comprising, an outer joining surface, an inner joining surface, the outer joining surface and the inner joining surface having defined there through a conduit opening for receiving cabling, and a bolt hole;
      a second end comprising an outer surface, an inner surface;
      a first sidewall extending between a first horizontal peripheral edge of the first end and a first horizontal peripheral edge of the second end;
      a second sidewall opposite the first sidewall; the second sidewall extending between a second horizontal peripheral edge of the first end and a second horizontal peripheral edge of the second end; the second sidewall and the first sidewall forming an acute angle; and
   a removable mounting plate; and
      the removable mounting plate configured to be positioned within the cavity and aligned with the inner joining surface of the first end or the inner joining surface of the second end.

2. The modular system of claim 1, further comprising:
   a J-form component comprising:
      a cavity;
      a first end comprising, an outer joining surface, an inner joining surface, the outer joining surface and the inner joining surface having defined there through a conduit opening for receiving cabling, and a bolt hole;
      a second end;
      a first sidewall extending between a first horizontal peripheral edge of the first end and a first horizontal peripheral edge of the second end; the first side wall having a J-shape; and
      a second sidewall opposite the first sidewall; the second sidewall extending between a second horizontal peripheral edge of the first end and a second horizontal peripheral edge of the second end.

3. The modular system of claim 2, the J-form component further comprising:
   a removable mounting plate;
      the removable mounting plate configured to be positioned within the cavity and aligned with the inner joining surface of the first end or the inner joining surface of the second end.

4. The modular system of claim 2, further comprising:
   a removable mounting plate configured to be positioned within the cavity of the J-form and aligned with the inner joining surface of the first end or the inner joining surface of the second end;
      the removable mounting plate having defined there through a conduit opening for receiving cabling, and a bolt hole; and
      the bolt hole of the removable mounting plate configured to receive a bolt from at least one bolt hole of another component.

5. The modular system of claim 2, the J-form component further comprising a window opening configured to receive a hatch.

6. The modular system of claim 5, the J-form component further comprising a window opening configured to receive a monitor.

7. The modular system of claim 5, the cavity of the J-form component dimensioned to contain electronic devices.

8. The modular system of claim 5, the cavity of the J-form component dimensioned to contain interactive electronics.

9. The modular system of claim 1, further comprising:
the removable mounting plate having defined there through a conduit opening for receiving cabling, and a bolt hole; and
the bolt hole of the removable mounting plate configured to receive a bolt from at least one bolt hole of another component.

10. The modular system of claim 1, the terminal component further comprising a window opening configured to receive a hatch.

11. The modular system of claim 1, the terminal component further comprising a display adapter configured to receive a display.

12. The modular system of claim 1, the cavity of the terminal component dimensioned to contain electronic devices.

13. The modular system of claim 1, the cavity of the terminal component dimensioned to contain a power source.

14. A modular system comprising:
a terminal component, comprising:
a body, the body comprising a cavity; and
the body comprising a first end comprising, an outer joining surface, an inner joining surface, the outer joining surface and the inner joining surface having defined there through a conduit opening for receiving cabling, and a bolt hole;
a second end;
a first sidewall extending between a first horizontal peripheral edge of the first end and a first horizontal peripheral edge of the second end;
a second sidewall opposite the first sidewall; the second sidewall extending between a second horizontal peripheral edge of the first end and a second horizontal peripheral edge of the second end; the second sidewall and the first sidewall forming an acute angle; and
an I-form component comprising:
a cavity;
a first end comprising, an outer joining surface, an inner joining surface, the outer joining surface and the inner joining surface having defined there through a conduit opening for receiving cabling, and a bolt hole;
a second end;
a first sidewall extending between a first horizontal peripheral edge of the first end and a first horizontal peripheral edge of the second end; the first side wall parallel to the second side wall;
a second sidewall opposite the first sidewall; the second sidewall extending between a second horizontal peripheral edge of the first end and a second horizontal peripheral edge of the second end.

15. The modular system of claim 14, further comprising:
a J-form component comprising:
a cavity;
a first end comprising, an outer joining surface, an inner joining surface, the outer joining surface and the inner joining surface having defined there through a conduit opening for receiving cabling, and a bolt hole;
a second end;
a first sidewall extending between a first horizontal peripheral edge of the first end and a first horizontal peripheral edge of the second end; the first side wall having a J-shape;
a second sidewall opposite the first sidewall; the second sidewall extending between a second horizontal peripheral edge of the first end and a second horizontal peripheral edge of the second end.

16. The modular system of claim 14, further comprising:
a removable mounting plate;
the removable mounting plate configured to be positioned within the cavity of the terminal component and aligned with the inner joining surface of the first end or the inner joining surface of the second end;
the removable mounting plate having defined there through a conduit opening for receiving cabling, and a bolt hole; and
the bolt hole of the second removable mounting plate configured to receive a bolt from at least one bolt hole of another component.

17. The modular system of claim 14, the window opening configured to receive a hatch.

18. The modular system of claim 14, the cavity of the terminal component dimensioned to contain electronic devices.

* * * * *